(12) United States Patent
Chang et al.

(10) Patent No.: US 8,164,401 B2
(45) Date of Patent: Apr. 24, 2012

(54) TUNABLE ARTIFICIAL DIELECTRICS

(75) Inventors: Mau-Chung Frank Chang, Los Angeles, CA (US); Daquan Huang, Allen, TX (US); William Hant, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 12/947,450

(22) Filed: Nov. 16, 2010

(65) Prior Publication Data

US 2011/0140798 A1 Jun. 16, 2011

Related U.S. Application Data

(62) Division of application No. 11/996,578, filed as application No. PCT/US2006/028915 on Jul. 25, 2006, now Pat. No. 7,852,176.

(60) Provisional application No. 60/705,870, filed on Aug. 4, 2005, provisional application No. 60/705,871, filed on Aug. 4, 2005, provisional application No. 60/794,012, filed on Apr. 21, 2006.

(51) Int. Cl.
*H01P 3/08* (2006.01)
*H03B 5/18* (2006.01)

(52) U.S. Cl. .................. 333/205; 333/246; 331/107 SL; 331/99; 331/177 V

(58) Field of Classification Search ............ 331/107 SL, 331/107 DP, 96, 99, 177 R, 177 V, 36 C; 333/204, 205, 208, 209, 24 C, 219.1, 235, 333/238, 239, 246

See application file for complete search history.

(56) References Cited

U.S. PATENT DOCUMENTS

| 6,646,605 | B2 | 11/2003 | McKinzie, III et al. |
| 7,091,802 | B2 | 8/2006 | Ham et al. |
| 2002/0040991 | A1 | 4/2002 | Embabi et al. |
| 2004/0196111 | A1 | 10/2004 | Oh et al. |
| 2004/0251974 | A1 | 12/2004 | Fukuda |
| 2005/0007208 | A1 | 1/2005 | Rivkina et al. |

OTHER PUBLICATIONS

Andress, et al., "Standing Wave Oscillators Utilizing Wave-Adaptive Tapered Transmission Lines", Mar. 21, 2005, IEEE Journal of Solid-State Circuits, vol. 40, No. 3, Mar. 2005, pp. 638-651.*
WIPO, related PCT Application No. PCT/US2006/028915, International Publication No. WO 2007/019056 dated Feb. 15, 2007, including international search report and written opinion issued on Feb. 23, 2007, pp. 1-63.

* cited by examiner

Primary Examiner — Ryan Johnson
(74) Attorney, Agent, or Firm — John P. O'Banion

(57) ABSTRACT

Tuning devices and methods are disclosed. One of the devices comprises a metal structure connected with artificial dielectric elements, and variable capacitance devices. Each variable capacitance device is connected with a respective artificial dielectric element and with a control signal. Control of the variation of the capacitance allows the desired tuning. Another device comprises metallic structures connected with artificial dielectric elements and switches connected between the artificial dielectric elements. Turning ON and OFF the switches allows the capacitance between artificial dielectric elements to be varied and a signal guided by the metallic structures to be tuned.

46 Claims, 19 Drawing Sheets $p_1 = l_A^1 + l_B^1 \quad p_2 = l_A^2 + l_B^2 \quad d = m \times p_1 + n \times p_2$

TUNABLE ARTIFICIAL DIELECTRICS

CROSS-REFERENCE TO RELATED APPLICATIONS

This application is a divisional of U.S. patent application Ser. No. 11/996,578 filed on Jan. 23, 2008, now U.S. Pat. No. 7,852,176, incorporated herein by reference in its entirety, which is a 35 U.S.C. 371 entry from PCT international application number PCT/US06/28915 filed on Jul. 25, 2006, incorporated herein by reference in its entirety, which claims priority from U.S. provisional patent application Ser. No. 60/705,870 filed on Aug. 4, 2005, incorporated herein by reference in its entirety, U.S. provisional patent application Ser. No. 60/705,871 filed on Aug. 4, 2005, incorporated herein by reference in its entirety, and U.S. provisional patent application Ser. No. 60/794,012 filed on Apr. 21, 2006, incorporated herein by reference in its entirety. Priority is claimed to each of the foregoing applications.

This application is also related to PCT International Publication No. WO 2007/019056 A2, published on Feb. 15, 2007, incorporated herein by reference in its entirety.

STATEMENT REGARDING FEDERALLY SPONSORED RESEARCH OR DEVELOPMENT

This invention was made with Government support under Grant No. N66001-04-1-8934, awarded by the U.S. Navy. The Government has certain rights in this invention.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND

1. Field

The present disclosure relates to tunable circuits, devices and methods. In particular, it relates to tunable artificial dielectrics.

2. Description of Related Art

Artificial dielectrics are known in the art and are made, for example, by distributing small polarizable particles in a uniform background material and represent a macroscopic analogue of a natural dielectrics. The polarizable particles can be either metallic particles or dielectric particles. Reference can be made, for example, to R. E. Collin, "Field Theory of Guided Waves" 2$^{nd}$ Edition, pp. 749-786, IEEE Press, New Jersey, 1990 or W. E. Kock, Metallic Delay Lenses, Bell System Tech. J., Vol. 27, pp. 58-82, 1948. Those two papers are incorporated herein by reference in their entirety.

Known artificial dielectric materials are, for example, discrete or floating metal spheres, disks, strips or rods, etc. When embedding these materials into an electromagnetic field, the artificial particles of these materials are polarized by the applied field, with the positive and negative charges displaced from each other. Each particle then acts as a dipole, contributing to the total charge displacement and thus to an effective dielectric constant.

FIG. 1 shows a plurality of floating metal sheets 1, where the positive and negative charges 2, 3 of each metal sheet are displaced from each other under the influence of an applied field E. The electromagnetic field polarized dipoles act as the artificial dielectrics.

A device based on the artificial dielectrics concept is shown, for example, in W. Andress and D. Ham, "Standing Wave Oscillators Utilizing Wave-Adaptive Tapered Transmission Lines," Symposium on VLSI Circuits Digest of Technology Papers, pp. 50-53, 2004, where an artificial dielectrics based standing wave oscillator is disclosed.

Further, wavelength or frequency tunability is important for radio frequency (RF), microwave and millimeter wave components and circuits. It can be used to tune the working frequencies of components, such as transmission lines, resonant tanks, antennas, delay lines, filters, inductors, transformers, baluns, duplexers and circuits, such as amplifiers, mixers, filters, VCOs, PLLs and any other circuits that employ wavelength or frequency or tuning filtering.

SUMMARY

The present disclosure addresses the above described two concepts in a novel and original manner.

According to a first aspect, a device is disclosed, comprising: a plurality of artificial dielectric elements; a metal structure coupled with the plurality of artificial dielectric elements; and a plurality of variable capacitance devices, each variable capacitance device having a first end connected with a respective artificial dielectric element of the plurality of artificial dielectric elements, and a second end; wherein each second end is adapted to be connected to a control signal, the control signal controlling variation of the capacitance of the variable capacitance devices.

According to a second aspect, a voltage controlled oscillator is disclosed, comprising: a metallic structure to guide an input wave; a plurality of artificial dielectric elements connected with the metallic structure, the input wave polarizing metal particles in the artificial dielectric elements; and variable capacitance devices, each having a first end connected with a respective artificial dielectric element, and a second end adapted to be connected with a control signal, the second ends of the variable capacitance devices forming a control input of the voltage controlled oscillator to control the frequency of the input wave.

According to a third aspect, a method for tuning a signal is disclosed, comprising: coupling a metal structure with a plurality of artificial dielectric elements, the metal structure adapted to guide the signal to be tuned; providing a plurality of variable capacitance devices, each variable capacitance device having a first end connected with a respective artificial dielectric element of the plurality of artificial dielectric elements, and a second end; connecting each second end to at least one control signal; and tuning the signal by varying the capacitance of the variable capacitance devices through the at least one control signal.

According to a fourth aspect, a device is disclosed, comprising: a first and a second plurality of artificial dielectric elements; a first metallic structure coupled with the first plurality of artificial dielectric elements; a second metallic structure coupled with the second plurality of artificial dielectric elements; and a plurality of switches, each switch connected with a respective artificial dielectric element of the first plurality of artificial dielectric elements and a respective artificial dielectric element of the second plurality of artificial dielectric elements, each switch further connectable with a control signal, the control signal tuning the frequency of a signal guided by the first and second metallic structures.

According to a fifth aspect, a device is disclosed, comprising: a plurality of artificial dielectric elements; a metallic structure coupled with the plurality of artificial dielectric elements; a plurality of switches, each switch having a first terminal connected with a respective artificial dielectric element of the plurality of artificial dielectric elements, a second terminal connected with ground, and a third terminal connectable with a control signal, the control signal tuning the frequency of a signal guided by the metallic structure.

According to a sixth aspect, a switch controlled oscillator (SCO) comprising the device of the fourth or fifth aspect is disclosed.

According to a seventh aspect, a resonator comprising a plurality of devices according to the fourth or fifth aspect connected in a closed loop arrangement is disclosed.

According to an eighth aspect, a transmission line comprising a device according to the fourth or fifth aspect is disclosed.

According to a ninth aspect, a switch controlled reconfigurable filter comprising the device of the fourth or fifth aspect is disclosed.

According to a tenth aspect, a synthesizer is disclosed, comprising: a voltage control oscillator (VCO); a transmission line connected to the VCO, the transmission line having a transmission line input and a transmission line output; a mixer adapted to mix a signal on the transmission line input with a signal on the transmission line output, the mixer having a mixer output; and a low pass filter connected with the mixer output, the low pass filter having a low pass filter output connected with the VCO, wherein the transmission line is a transmission line comprising a device in accordance with the fourth or fifth aspect.

According to an eleventh aspect, a delay locked loop (DLL) device is disclosed, comprising: a voltage control oscillator (VCO); a transmission line connected to the VCO, the transmission line having a transmission line input and a transmission line output; a mixer adapted to mix a signal on the transmission line input with a signal on the transmission line output, the mixer having a mixer output; a low pass filter connected with the mixer output, the low pass filter having a low pass filter output; a control logic block connected with the low pass filter output, the control logic block having a control logic block output; wherein the transmission line is a transmission line comprising a device in accordance with the fourth or fifth aspect.

The teachings of the present disclosure can be used to tune working frequencies of components, such as transmission lines, resonant tanks, antennas, delay lines, filters, inductors, transformers, baluns, duplexers and circuits, such as amplifiers, mixers, filters, VCOs, PLLs and/or any other circuits that employ wavelength or frequency tuning or filtering.

High effective dielectric constants can be achieved, which is highly desirable in integrated circuits because of the small size of passive components.

The teachings of the present disclosure are compatible with main stream IC processes that comprise multiple metal layers, such as CMOS, BiCMOS, bipolar and SiGe technologies.

A large linear dynamic/tuning range can be obtained due to the large dielectric constant tuning range.

BRIEF DESCRIPTION OF THE DRAWING(S)

FIG. 1, already discussed above, is a schematic diagram showing the general concept of artificial dielectrics.

Figure 8:
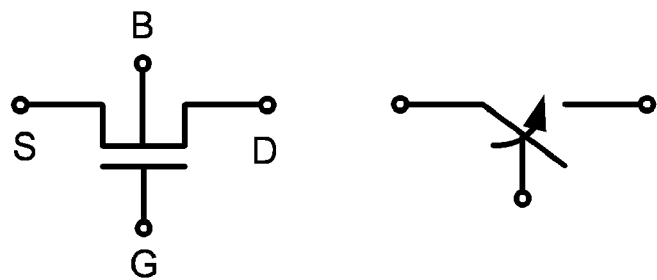

FIG. 8 schematically shows a MOS transistor and a switch symbol.

Figures 9, 10:
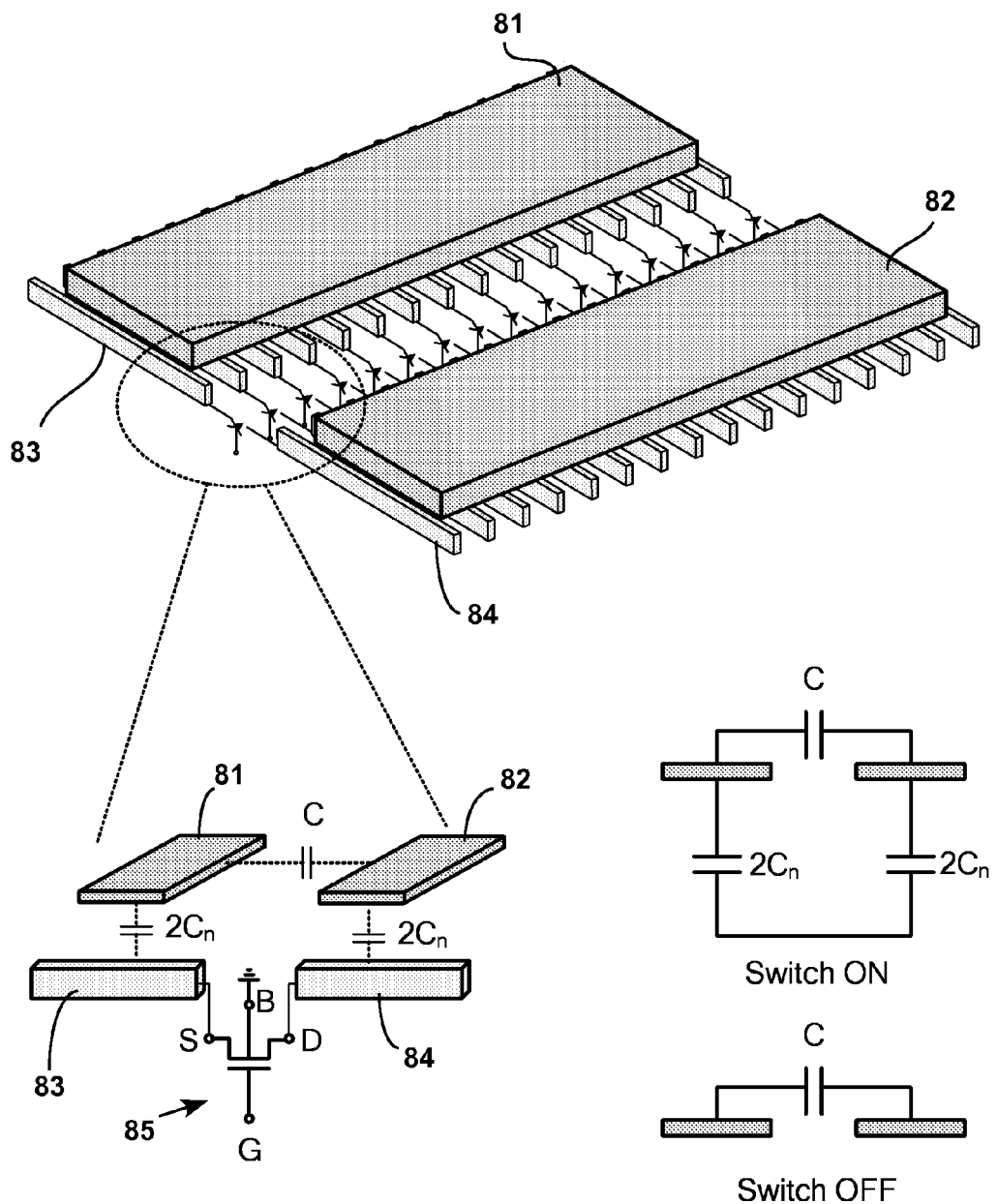

FIG. 9 shows an embodiment of the present disclosure making use of the MOS transistor of FIG. 8.

FIG. 10 shows an electric equivalent circuit of the enlarged section of FIG. 9.

Figure 11:
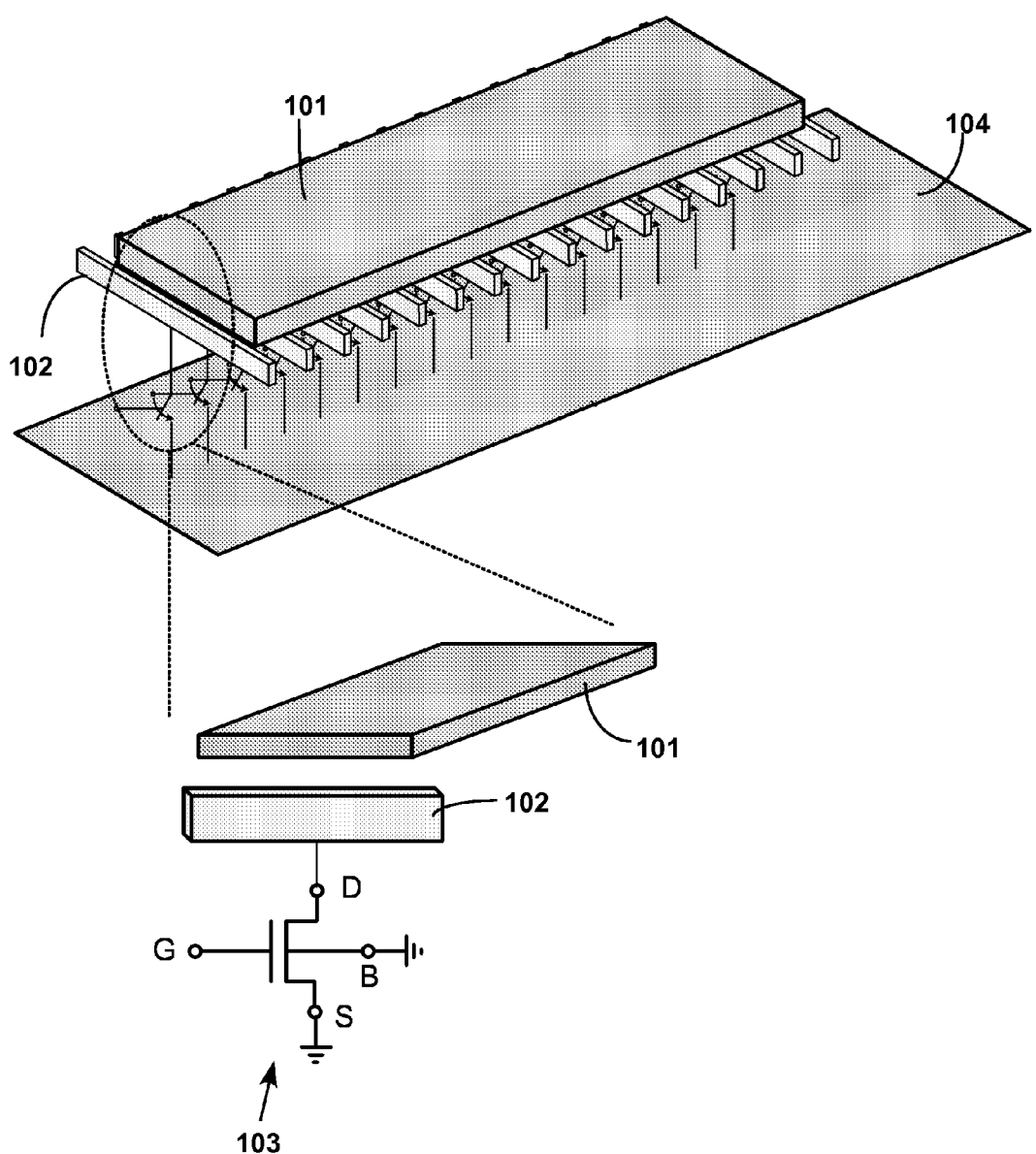

FIG. 11 shows a further embodiment of the present disclosure.

Figure 12A:
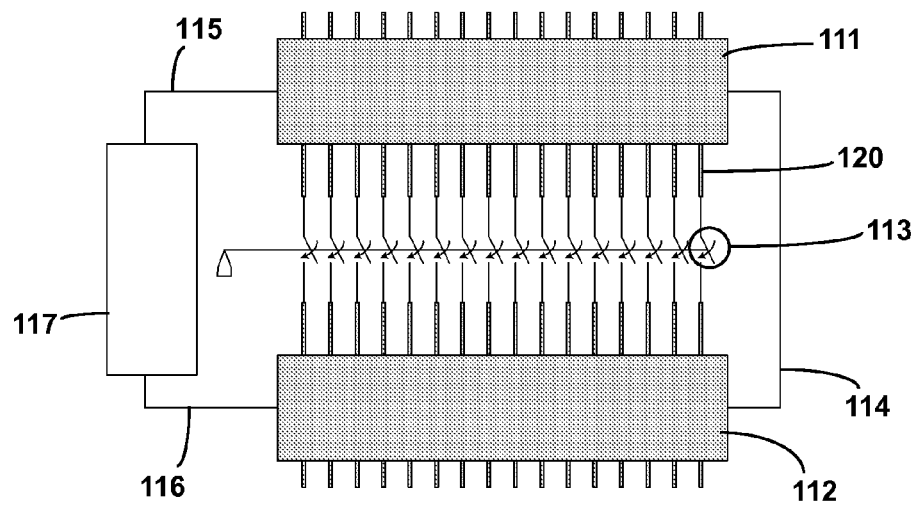

FIG. 12A shows a differential quarter-wavelength standing-wave transmission-line resonator based switch controlled oscillator (SCO).

Figure 12B:
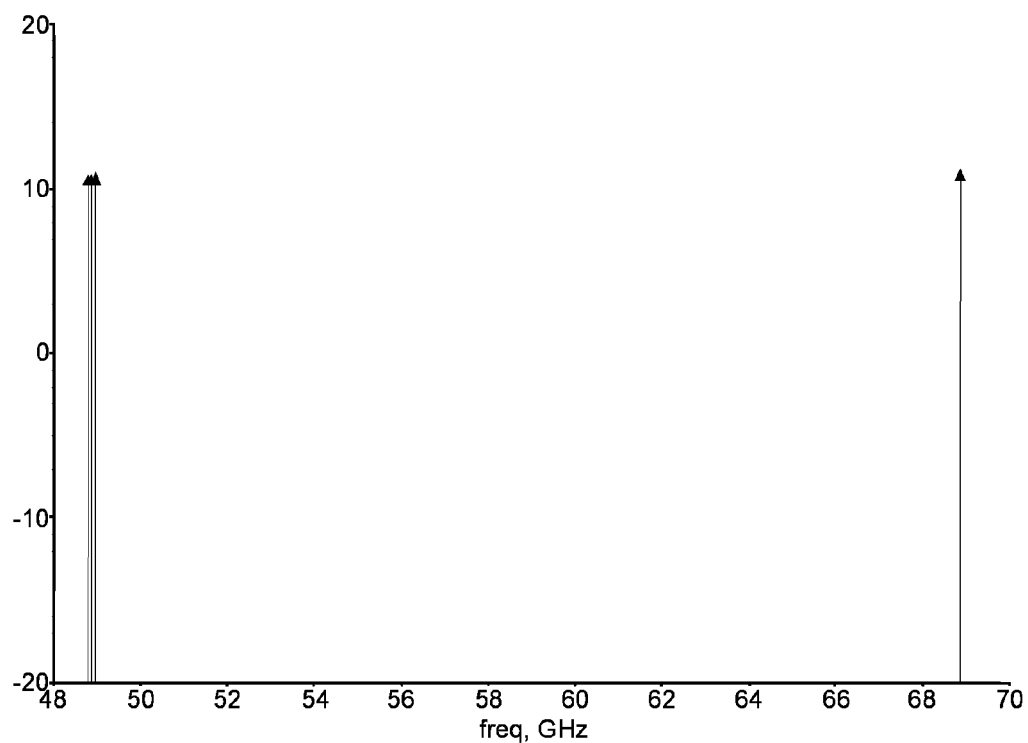

FIG. 12B shows a simulation diagram related to the embodiment of FIG. 11A.

Figure 13:
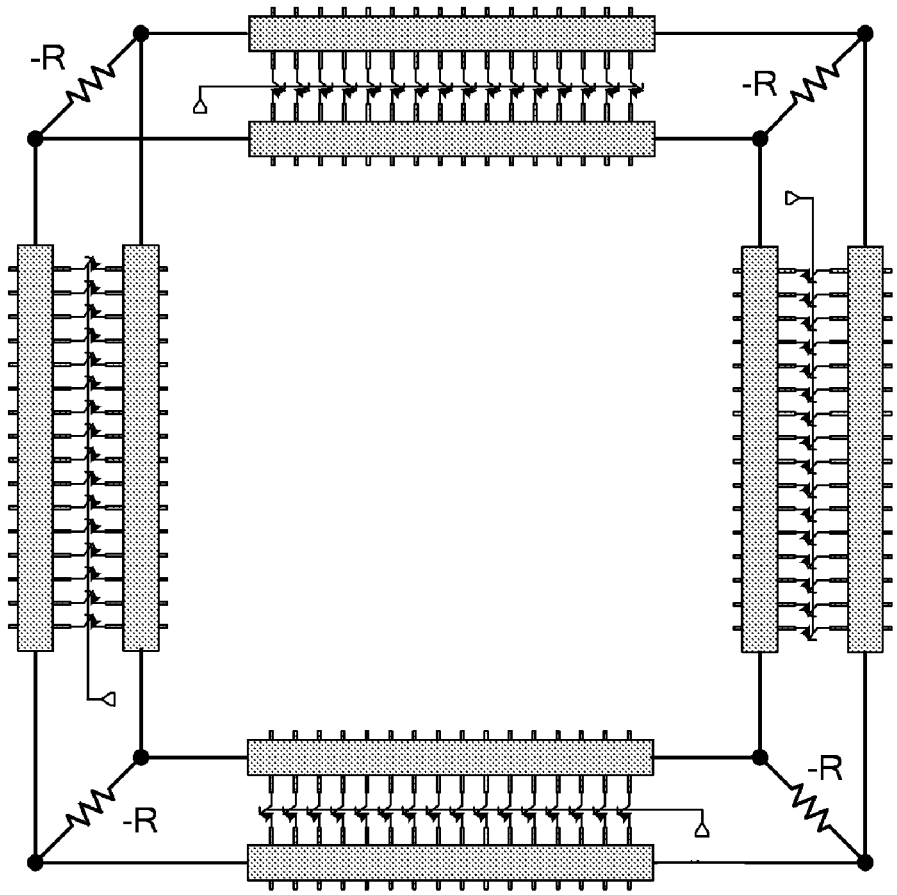

FIG. 13 shows a traveling-wave transmission-line resonator.

Figure 14:
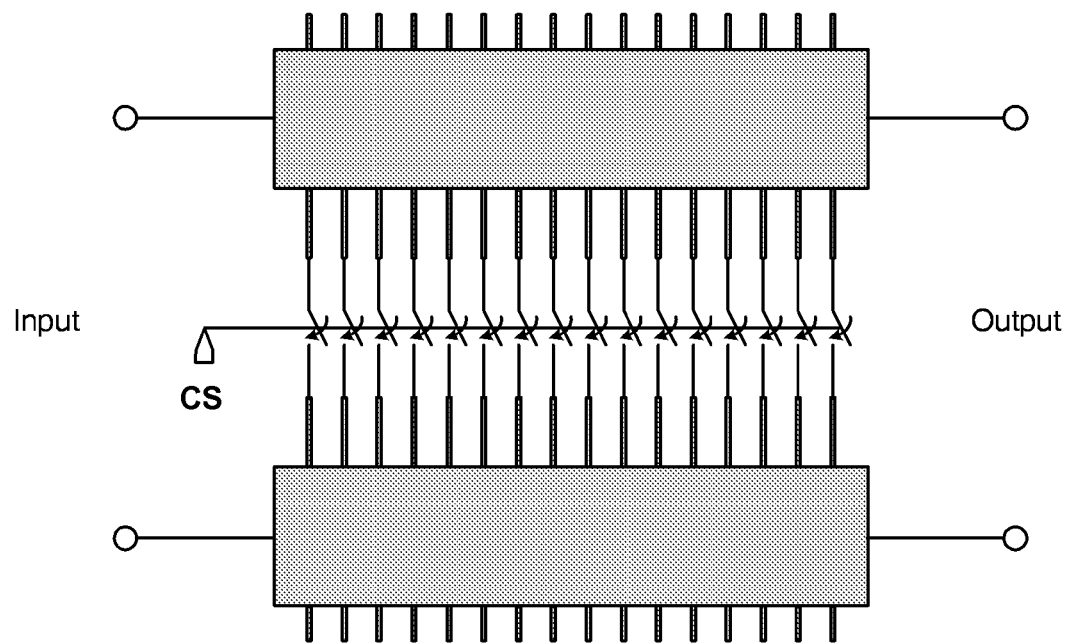

FIG. 14 shows a transmission line based on the teaching of the present disclosure.

FIGS. 15A-15D show simulated phase shift results with reference to the embodiment of FIG. 14.

FIGS. 16A-16D show characteristic impedances of two different transmission line structures.

Figure 17A:
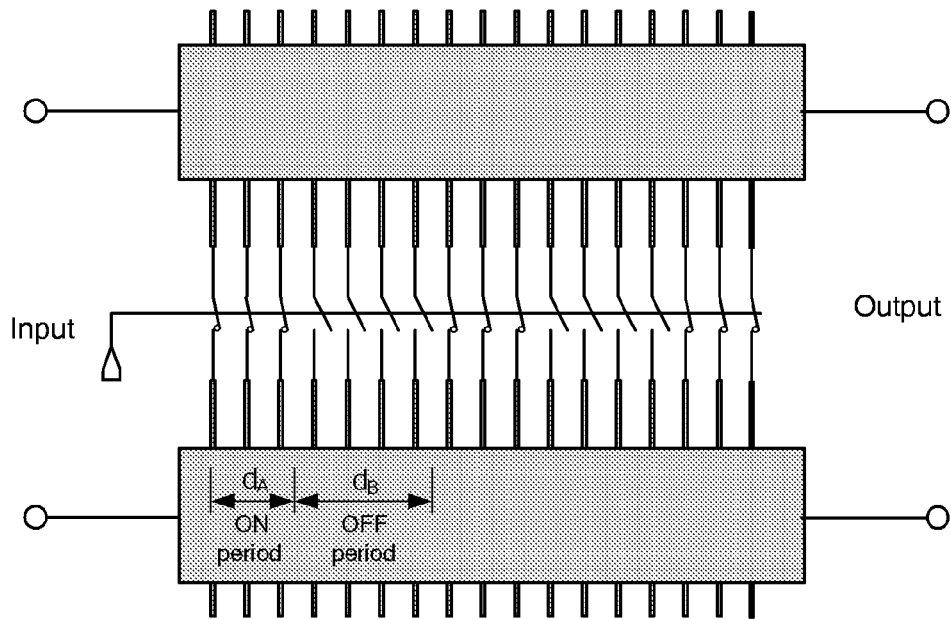
Figure 17B:
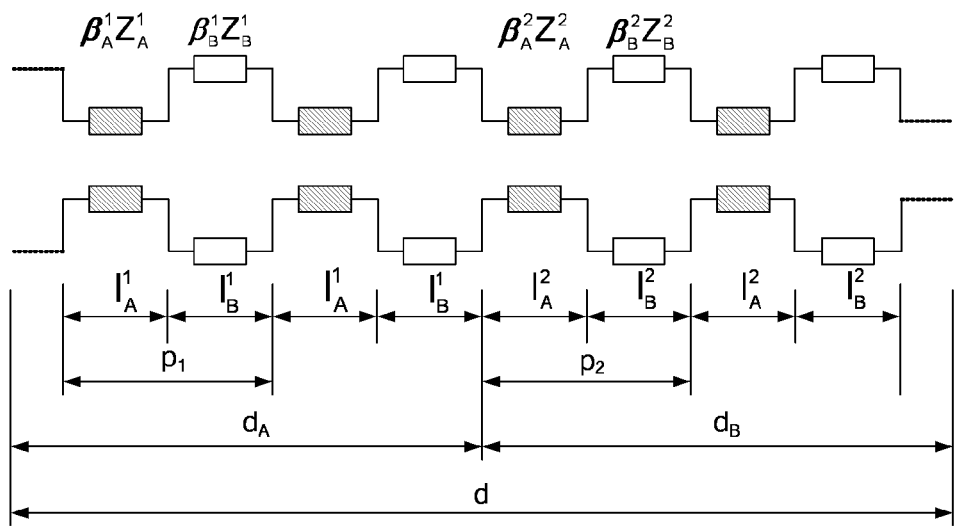

FIGS. 17A and 17B show an embodiment of a switch controlled reconfigurable filter (SCRF) in accordance with the present disclosure.

Figure 18A:
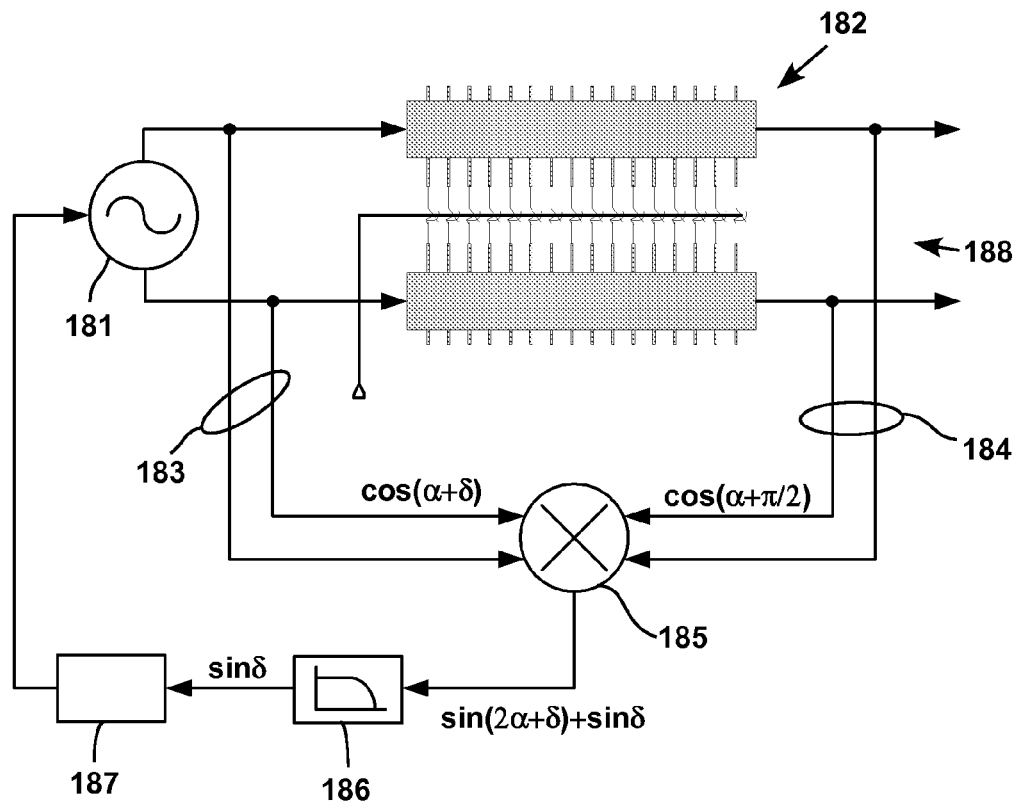
Figure 18B:
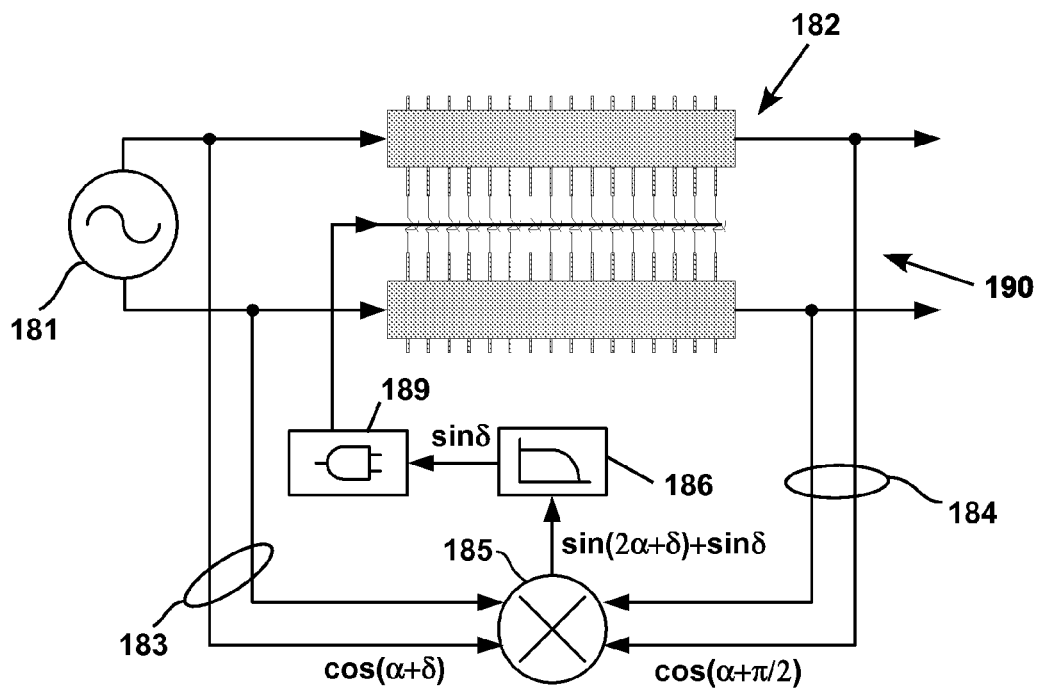

FIGS. 18A and 18B show application of transmission lines in accordance with the present disclosure to phase-locked loop (PLL) and delay-locked loop (DLL) devices.

DETAILED DESCRIPTION

Figure 1:
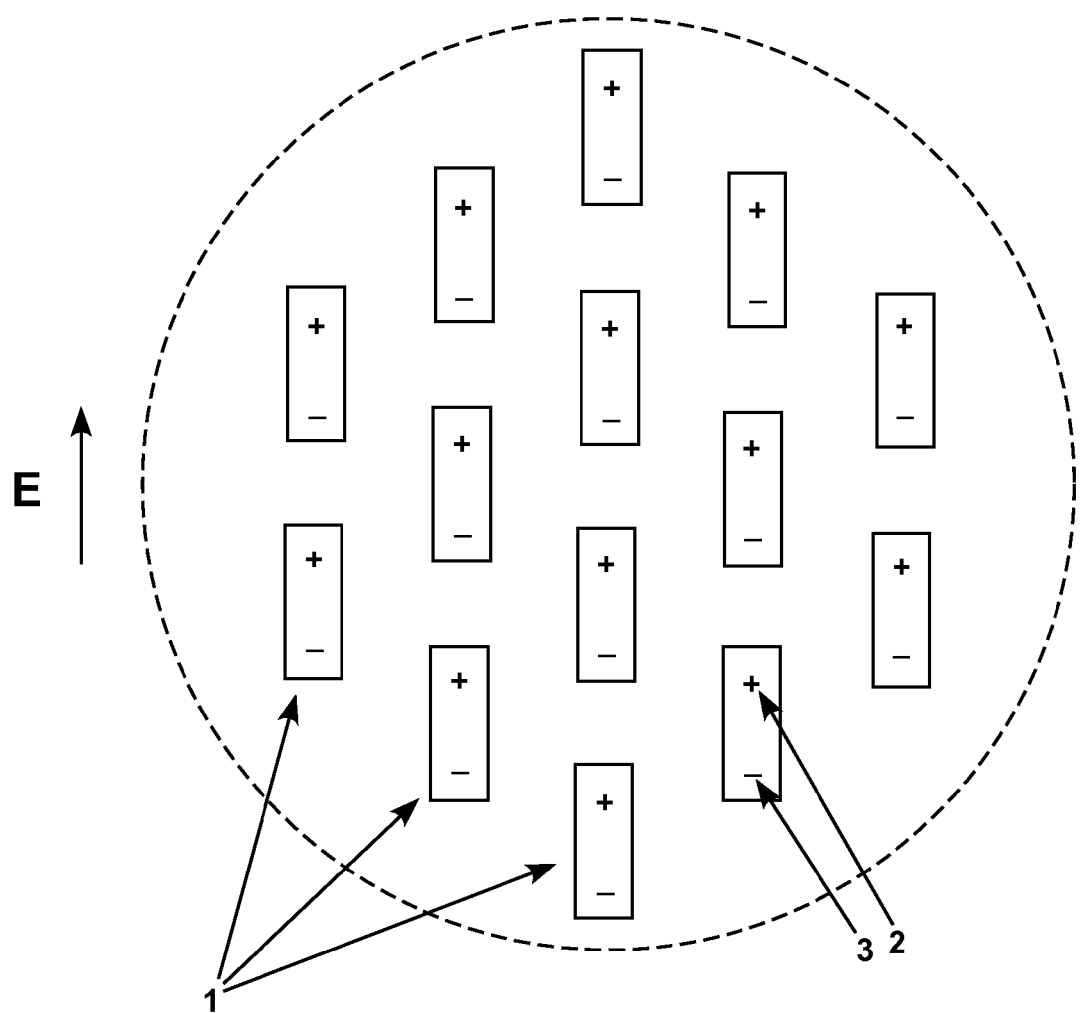
Figure 2:
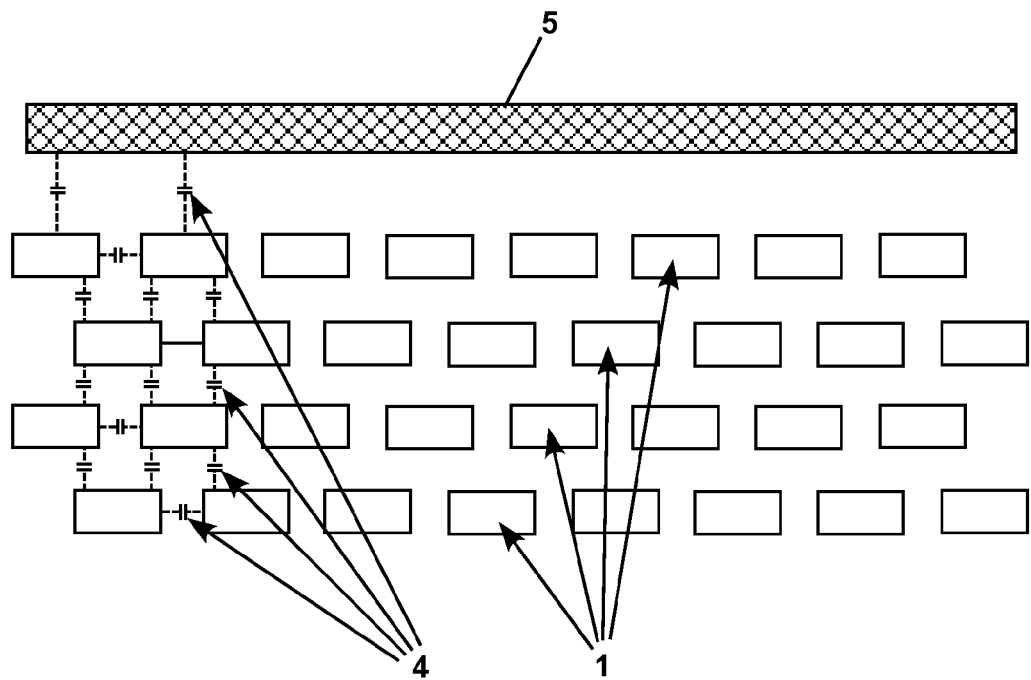
FIG. 2 shows an electric equivalent diagram of FIG. 1.

FIG. 2 is an electric equivalent diagram of FIG. 1, where parasitic capacitances 4 among the particles of the metal sheets 1 are shown. The electromagnetic wave creating the applied field is typically guided by metallic structures 5, such as transmission lines, resonant tanks, antennas, inductors and transformers, and propagates through the artificial dielectrics, as shown in FIG. 2.

Variation of the parasitic capacitances 4 modifies the artificial dipole distribution or the permittivity (capacitance ratio) as seen by the electromagnetic wave of the applied field, which in turn changes the wavelength of the applied field accordingly.

The applicants have noted that variation of capacitance between the elements forming allows the frequency of an applied signal to be tuned. In particular, the present disclosure discloses a way of changing the permittivity that characterizes the effect of dipoles in artificial dielectrics.

According to a first embodiment of the present disclosure, in order to tune the dielectric constant, variable capacitance devices, such as varactors and diodes, are used such that one end of each variable capacitance device is connected to one of the artificial particles, and the other ends of all capacitance devices (or all in a group) are tied together and connected to control signals.

Figure 3:
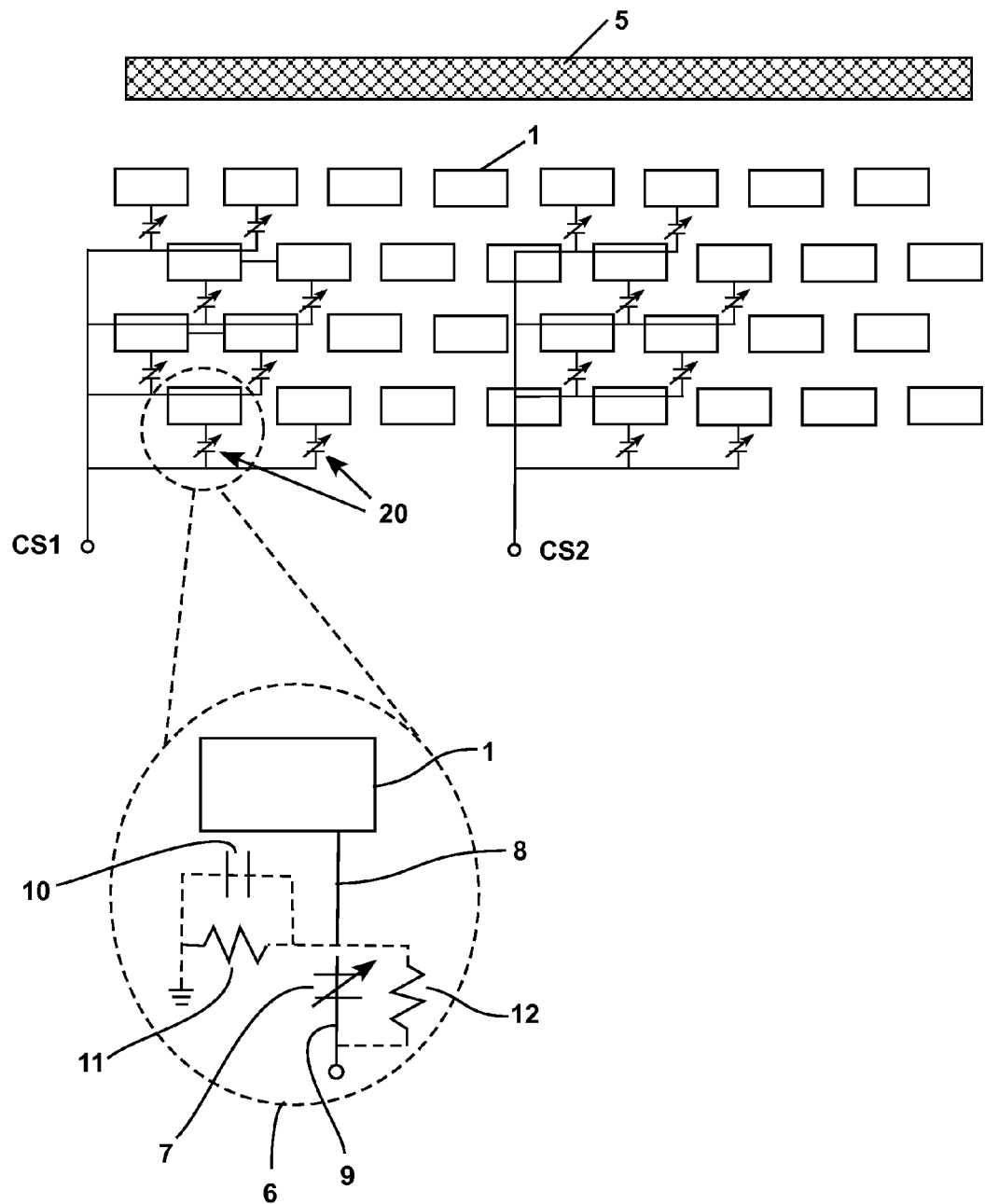
FIG. 3 shows an embodiment of a structure in accordance with the present disclosure.

FIG. 3 shows an embodiment of a structure in accordance with the present disclosure, where two groups of variable capacitance devices are shown, for exemplary purposes. The schematic diagram of FIG. 3 shows a plurality of artificial particles (e.g. floating metal sheets) 1 and a metallic structure 5 to guide electromagnetic waves as already discussed with reference to FIG. 2 above. Also shown in FIG. 3 are variable capacitance devices 20 connected with the metal sheets 1. A first end of each variable capacitance device 20 is connected to a respective metal sheet 1. A second end of each variable capacitance device or a second end of each group of variable capacitance devices is connected to a control signal. In this respect, FIG. 3 shows two control signals: Control Signal 1 (CS1) and Control Signal 2 (CS2).

The enlarged section 6 of FIG. 3 shows an artificial particle (e.g. a floating metal sheet) 1 and a variable capacitance device 7. The device 7 can be, for example, a variable capacitance diode (varactor). A first end 8 of the variable capacitance device 7 is connected to the particle 1. A second end 9 of the variable capacitance device 7 is connected to a control signal. As shown in the embodiment of FIG. 3, the second ends of a first group of variable capacitance devices are connected to a first control signal (Control Signal 1), while the second ends of a second group of variable capacitance devices are connected to a second control signal (Control Signal 2). The person skilled in the art will devise alternative embodiments, where a single group (connection to a single control signal) or multiple groups of variable capacitance devices (connections to multiple control signals) are provided. The enlarged section 6 of FIG. 3 also shows parasitic parameters, such as a parasitic capacitance 10 and parasitic resistances 11, 12. The value of the total variable capacitance 20 connected to every artificial particle 1 is determined by the capacitive equivalent of a combination between the variable capacitance 7 and all parasitic parameters.

Variation of the control signals (e.g., Control Signal 1 and Control Signal 2 in FIG. 3) changes the capacitance 20 connected to each of the artificial particles 1, and thus has an effect on the permittivity of the artificial medium due to capacitance changes in the variable capacitance devices 20. As a result, the wavelength of the wave speed of the electromagnetic wave guided by the metal structures becomes tunable.

Differential topologies are preferred for the metal structures to guide the electromagnetic wave due to the presence of a virtual ground, which provides a well defined signal return path for the two branches of differential structures and thus confines the electromagnetic field within the artificial dielectrics.

Figure 4A:
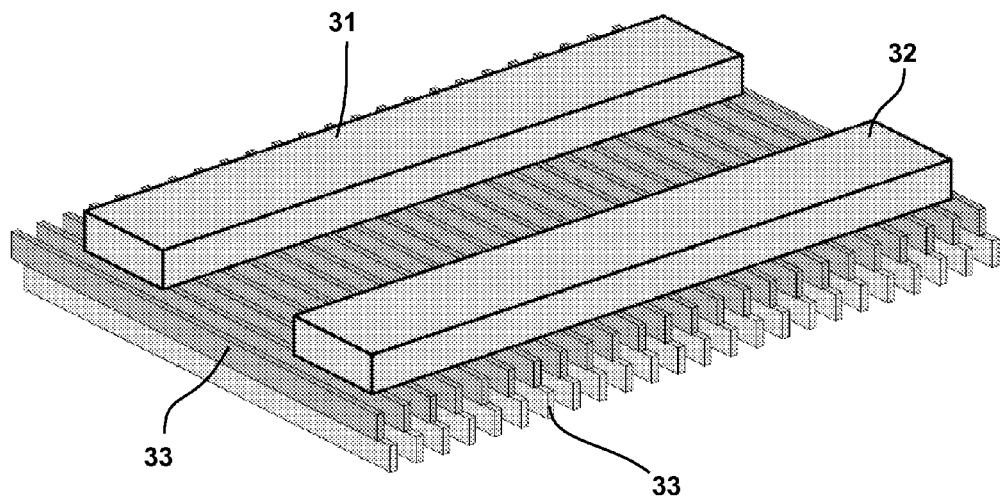
FIGS. 4A-4D show examples of tunable artificial dielectrics.
Figure 4B:
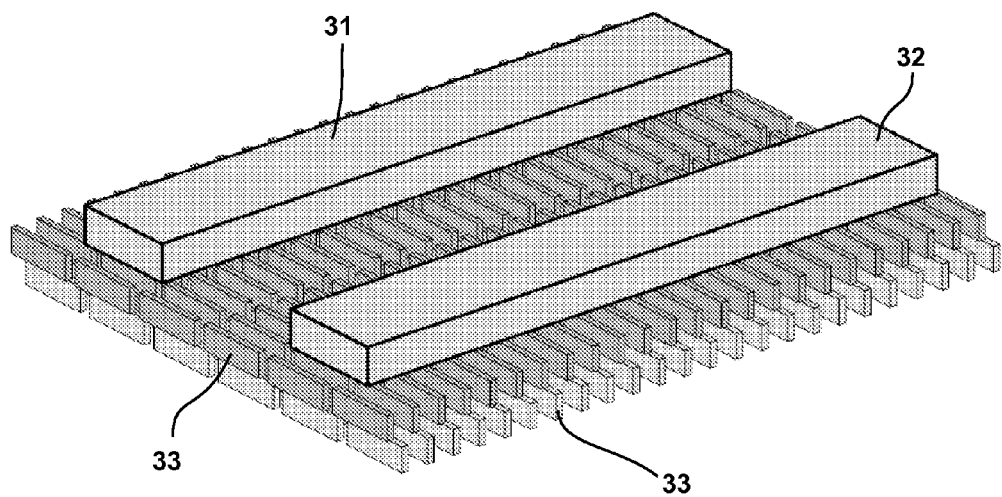

FIGS. 4A and 4B show a first example of a tunable artificial dielectrics acting as a standing wave resonant tank and comprising a metal structure having a first branch 31 and a second branch 32, together with a plurality of artificial dielectric elements 33 coupled with the branches 31 and 32. In the embodiment of FIG. 4B, the dielectric elements 33 can be smaller strips, distributed in a staggered configuration. The elements 33 can be located on one or more levels. FIGS. 4A and 4B show strips 33 located on two different levels. The person skilled in the art will understand that strips having various dimensions and located on various levels can be provided. Usually, the higher the number of levels the more the electromagnetic field can be isolated from penetration into the lossy silicon substrate under the elements. The metallic structure is located at a distance from the artificial dielectric elements. The distance (gap) between the metallic structure and the artificial dielectric elements can be in the order between 0.3 μm to few microns, depending on the processes. However, modern deep sub-micron technologies can be used, to obtain a gap as small as 0.12 μm. Generally, the smaller the gap the better the polarization of the artificial dielectric elements.

Figure 4C:
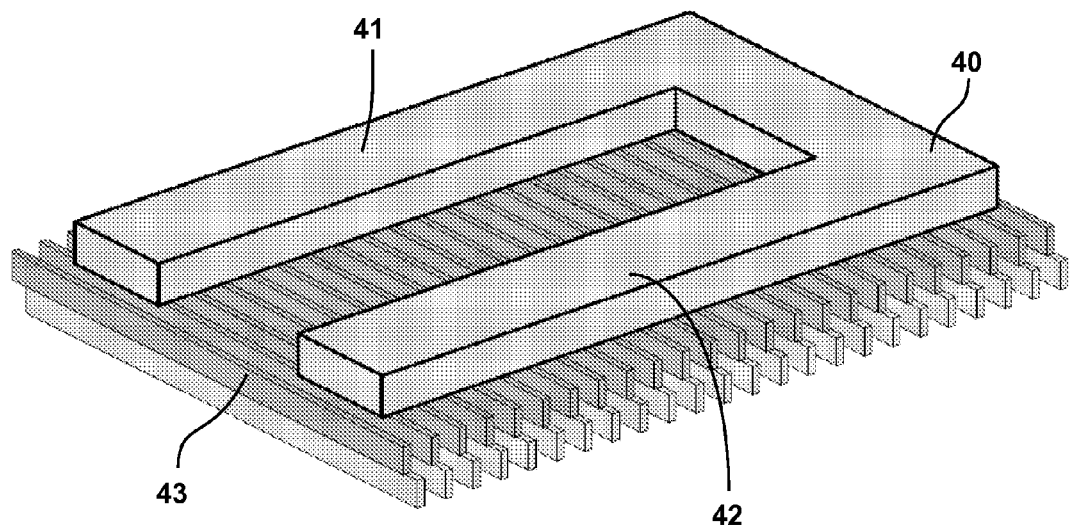
Figure 4D:
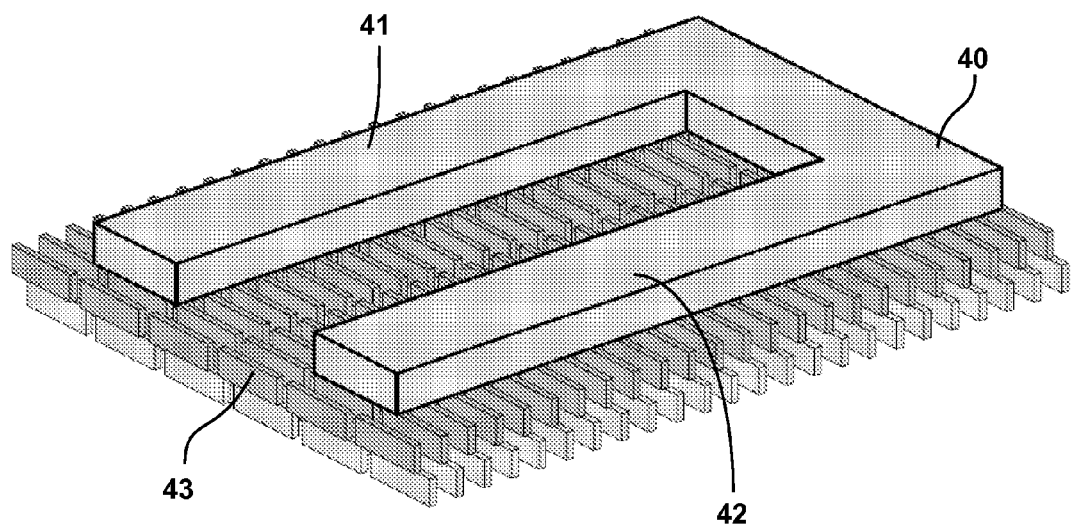

FIGS. 4C and 4D provide a second example of tunable artificial dielectrics acting as a standing wave resonant tank, comprising a U-shaped metal structure 40 with branches 41 and 42, together with a plurality of artificial particles 43. Also in this case, strips having various dimensions and located on various levels can be provided.

Tunable artificial dielectric tanks like the ones shown in FIGS. 4A and 4B usually have an open-circuited end and a short-circuited end. Therefore, the external (active) circuits which sense the standing wave signal in the tank and compensate the loss of the tank may have either open-circuited or short-circuited interfaces. Standing wave tanks have the highest voltage signal at the open-circuited end and the largest current signal at the short-circuited end. It is preferable not to draw too much energy from the tank when connecting circuits to the tank. In order to do that, voltage coupling should be used between open-circuited ends between tanks and circuits, and current coupling should be used between short-circuited ends between tanks and circuits.

Figure 5A:
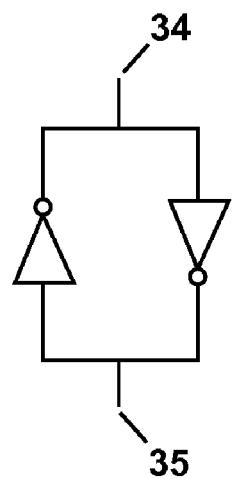
FIGS. 5A-5C show open-circuited voltage coupled excitation circuits for a tunable artificial dielectrics standing wave resonant tank VCO in accordance with the present disclosure.
Figure 5B:
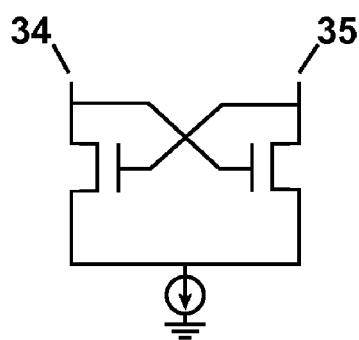
Figure 5C:
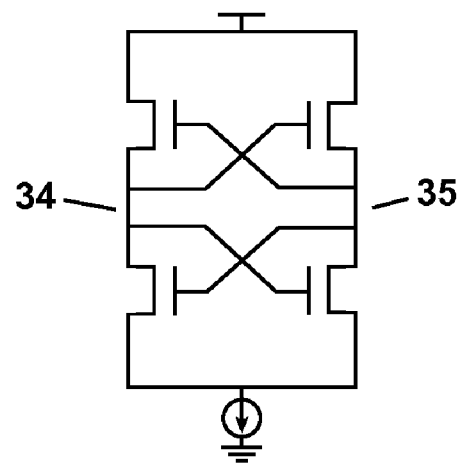

FIGS. 5A-5C provide examples of open-circuited voltage coupled excitation circuits for a tunable artificial dielectrics standing wave resonant tank VCO in accordance with the present disclosure, with oscillator outputs 34, 35 shown.

Some of the advantages of the circuits of FIGS. 5A-5C are:

Indirectly tuning the VCO frequency by varying the wavelength or wave speed. As a result, frequency tuning effects are accomplished in light of the isolating tuning mechanism from the positive feedback loop used in conventional oscillators, resulting in much less noise;

Isolating the signal (i.e. the electromagnetic wave) from the substrates which, in silicon processes, are very noisy and lossy;

No loss in the artificial dielectrics because no current flows in the artificial particles;

High Q-factor due to the isolating substrate mechanism and lossless artificial dielectrics;

High effective dielectric constants can be achieved, which is highly desirable in integrated circuits because of the small size of passive components;

Compactable with main stream IC processes that comprise multiple metal layers, such as CMOS, BiCMOS, bipolar and SiGe technologies;

Large linear frequency tuning range due to a large dielectric constant tuning range.

The teachings of the present disclosure allow to accomplish frequency tuning effects which result in much less noise when compared to conventional tunable resonant tanks, such as LC tanks.

Figure 6A:
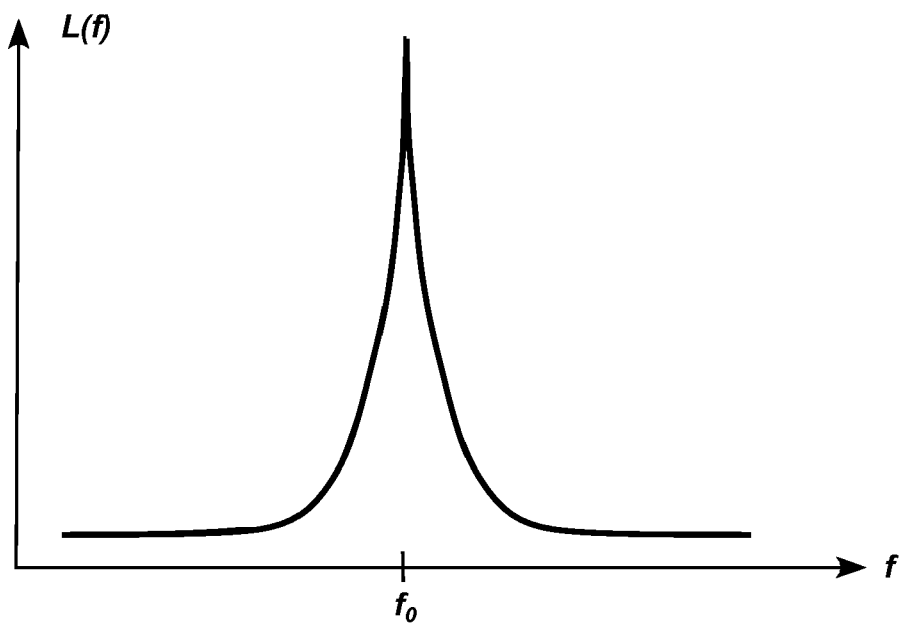
FIGS. 6A and 6B show VCO phase noise comparison diagrams.
Figure 6B:
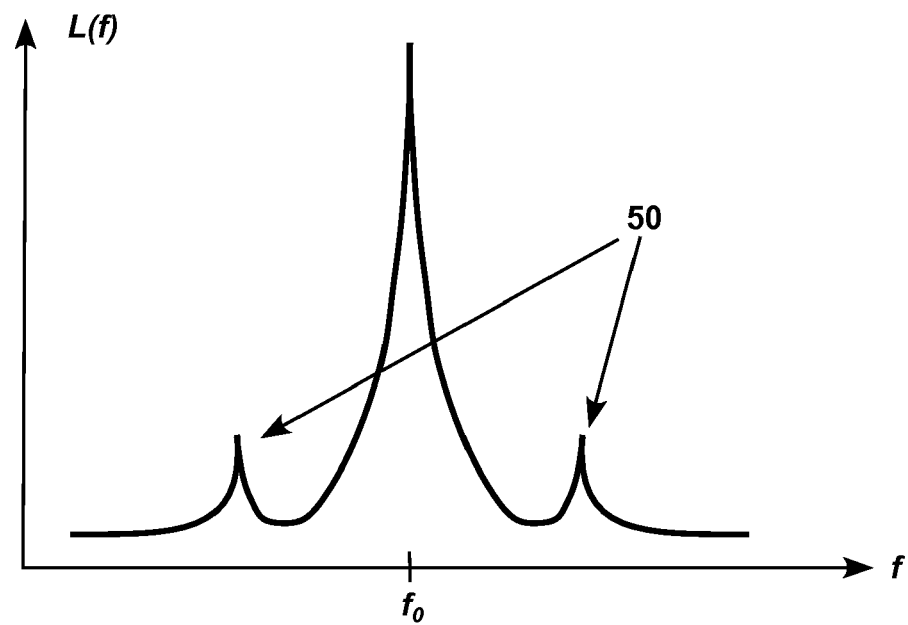

FIGS. 6A and 6B show a VCO phase noise L(f) comparison between the tunable dielectrics in accordance with the present disclosure (FIG. 6A) and a conventional LC tank (FIG. 6B). FIG. 6B shows control signal noise induced phase noise signal portions 50 which are not present in the diagram of FIG. 6A.

The teachings of the present disclosure allow the signal (i.e. the electromagnetic wave) to be isolated from the substrates, which are very noisy and lossy in silicon processes.

Figure 7:
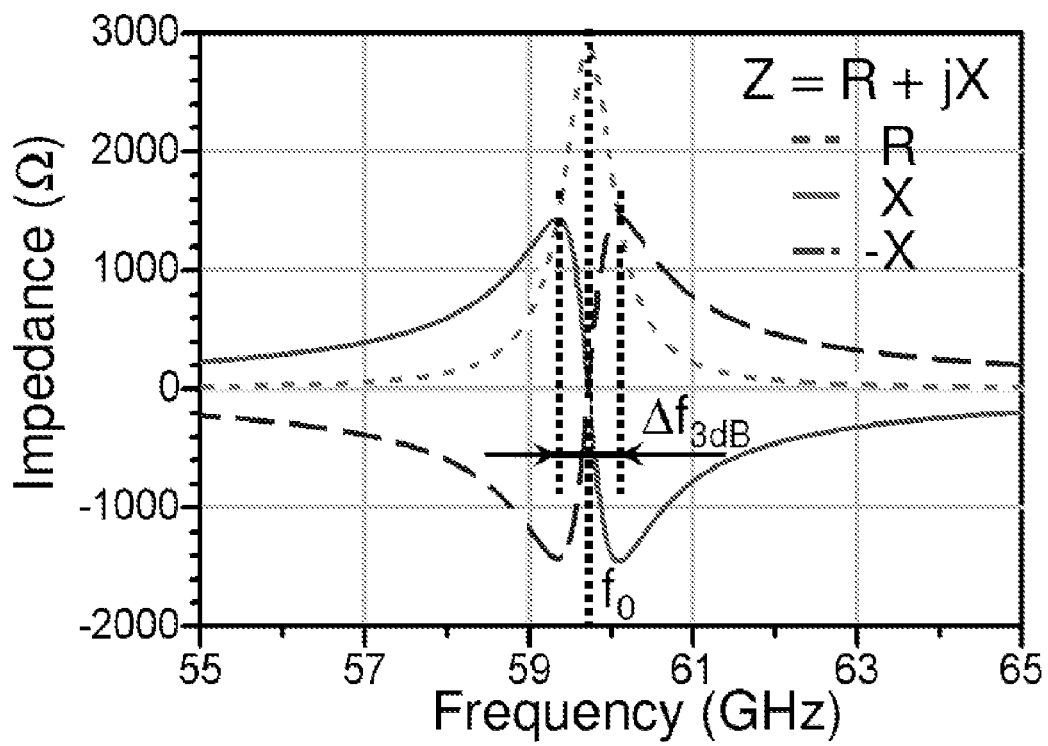
FIG. 7 is a diagram showing a Q-factor obtainable in accordance with the present disclosure.

Additionally, there is no loss in the artificial dielectrics, because no current flows in the artificial particles. In view of the above advantages, a high Q-factor is obtained, as shown in FIG. 7. Such Q-factor can be very high even in commercial CMOS processes at frequencies as high as 60 GHz.

According to a further embodiment of the present disclosure, an embedded artificial dielectric can be realized in MOS or CMOS technology with adaptive permittivity controlled by MOS or CMOS switches to achieve frequency synthesis/tuning/hopping, phase shift/delay, dynamic impedance matching and bandpass filtering over broad frequency ranges in real-time.

In particular, the applicants have noted that variation of the effective capacitance (or permittivity) of an embedded artificial dielectric by using shunt CMOS variable capacitors (varactors) can be limited by the frequency tuning range which is inversely proportional to the dielectric boost factor defined in Eq. (1).

$$\frac{\Delta f}{f} = -\frac{1}{2}\frac{\Delta C'}{C'} = -\frac{1}{2}\frac{\Delta C_v}{\kappa C + C_v} \qquad (1)$$

where $\kappa C$ is the equivalent capacitance for the artificial dielectric, $C_v$ is the total capacitance of the varactors, and $\Delta C_v$ is the maximum capacitor tuning range. When a large boost factor (k=22) is implemented to reduce the on-chip resonator size, the maximum tuning range is reduced to less than 5%.

To overcome the difficulty in reaching broadband frequency tuning in modern software radios, a further embodiment to control the permittivity of the embedded artificial dielectric provides for insertion of MOS switches.

FIG. 8 shows a MOS transistor and a switch symbol. The MOS transistor comprises two connecting terminals (source S and drain D) and one controlling terminal (gate G). The body B of the MOS transistor is usually connected to ground.

FIG. 9 shows differential metallic structures 81, 82 coupled with a plurality N of metal strips (or, more generally, artificial particles) 83, 84. As already previously discussed, the metallic structures 81, 82 guide the wave while the N floating metal strip pairs 83, 84 serve as floating conducting obstacles of artificial dielectrics. The arrangement of FIG. 9 also shows connection to a plurality of MOS switches 85 as shown in the enlarged portion of FIG. 9. In particular, each metal strip couple 83, 84 is connected to the source S and drain D, respectively, of a MOS switch, while the control signal is adapted to be connected to the gate G of the MOS switch 85.

FIG. 10 shows an electric equivalent circuit of the enlargement of FIG. 9, with the switch ON (top portion of FIG. 10) or the switch OFF (bottom portion of FIG. 10).

FIG. 11 shows a further embodiment, where a metallic structure 101 is coupled with a plurality of metal strips 102. The arrangement of FIG. 11 also shows connection to a plurality of MOS switches 103 as shown in the enlarged portion of FIG. 11. In particular, each metal strip 102 is connected to the drain D of a MOS switch 103, the source S of the switch being connected to a ground plane 104. Also in this case, the control signal (a digital control signal, for example) is connected to the gate G of the switch 103.

In both embodiments, when all MOS switches are turned on, the artificial dielectric reaches its highest permittivity and achieves boost-factor given by $$\kappa = \frac{\varepsilon'}{\varepsilon} = \frac{C'}{C} = \frac{C + C_{AD}}{C} \qquad (2)$$

where C' and C are the respective unit volume capacitance with and without the embedded artificial dielectric. And $C_{AD}$ is the sum of incremental capacitances generated by N floating strips of the embedded artificial dielectric, which can be expressed as $$C_{AD} = \sum_{n=1}^{N} C'_n \qquad (3)$$

where $C'_n$ is the n'th incremental capacitance contributed by a differential metal strip pair. For calculation purposes, see also R. E. Collin, "Field Theory of Guided Waves" $2^{nd}$ Edition, pp. 749-786, IEEE Press, New Jersey, 1990 and D. Huang, W. Hant, N.-Y. Wang, T. W. Ku, Q. Gu, R. Wong and M. F. Chang, "A 60 GHz CMOS VCO Using On-Chip Resonator with Embedded Artificial Dielectric for Size, Loss and Noise Reduction," ISSCC Digest of Technical Papers, pp. 314-655, February 2006.

On the other hand, when each CMOS switch is turned off, it disconnects the metal strip pair and forbids the charge exchange between them. Effectively, this renders the $C'_n$ to zero if neglecting the parasitic capacitance. Therefore, by turning selective MOS switches on and off with a programmable digital controller, the permittivity or the equivalent boost factor of the artificial dielectric can be varied to a very large range (from 1 to k) and with very fine resolution $\Delta k$ of $$\Delta \kappa(n) = \frac{C'_n}{C} \qquad (4)$$

This results in a digital-controlled effective permittivity, ∈', which enables variable transmission wavelength with i th switch turned-on and j th switch turned-off as, $$\lambda_{DiCAD} = \frac{\lambda}{\sqrt{1 + \sum_{n=i;\neq j}^{N} \Delta \kappa(n)}} \qquad (5)$$

where $\lambda_{DiCAD}$ and $\lambda$ are the effective wavelength with and without artificial dielectrics.

The applicants have called the techniques of the present disclosure Digital Controlled Artificial Dielectric as DiCAD. DiCAD has many potential applications in modern multi-band software radio systems, including:

Switch Controlled Oscillator (SCO)

FIG. 12A shows a differential quarter-wavelength standing-wave transmission-line resonator based SCO with embedded DiCAD. The differential resonator, say for 60 GHz oscillation, is made of a one-end shorted co-planar strip 111 with a length of L=320 µm, a width of W=15 µm and a gap of S=10 µm. 320 pairs of 1 µm metal strips 120 with gap size of 1 µm are evenly placed underneath the transmission line for serving as the artificial dielectric. The connectivity of the metal strip pair 111, 112 is controlled by the inserted NMOS switch 113 as described previously. By selectively turning the NMOS ON or OFF (by way of a digital control bit, for example), a very broad frequency tuning range (over 20 GHz) can be achieved simultaneously with very fine tuning step of 80 MHz as indicated in the simulation of FIG. 12B. In particular, FIG. 12B shows four frequency spectra where, from left to right: the first one is obtained with all switches ON, the second one is obtained with one switch OFF and the remaining switches ON, the third one is obtained with two switches OFF and the remaining switches ON, and the fourth one is obtained with all switches OFF.

The circuit of FIG. 12A comprises a shorted circuit end 114 and an open circuit end 115, 116. As already explained with reference to a tank embodiment, the shorted circuit end forms a standing wave resonator, while the open-circuit end is connected to an excitation network 117 which provides gain or negative resistance –R to compensate for resonator loss.

In addition, similar tuning range and resolution can be achieved from a traveling-wave transmission-line resonator as indicated in FIG. 13. The active negative resistor –R shown in FIG. 13 compensates for transmission losses. Traveling-wave transmission-line resonators are known as such. See, for example, J. Wood, T. C. Edwards and S. Lipa, "Rotary Traveling-Wave Oscillator Arrays: A New Clock Technology," IEEE JSSC, Vol. 36, No. 11, November 2001. FIG. 13 shows an embodiment with four artificial dielectrics devices. Further embodiments can also be provided with a different number of devices (e.g. 2, 3, 5 etc.) so long as a closed loop is obtained.

Switch Controlled Phase Shifter (SCPS)

The propagation constant of a transmission line with embedded DiCAD is given by $$\beta = \frac{2\pi}{\lambda_{DiCAD}} \tag{6}$$

For a transmission line with a fixed length, changing the wavelength λ changes the electrical length or phase delay from one end to the other end of the transmission line.

FIG. 14 shows a DiCAD based transmission line that can shift the phase of an output signal and change the characteristic impedance $Z_0$ of a transmission line according to the digital control bits. Therefore, the embodiment of FIG. 14 allows phase delay and characteristic impedance of a transmission line to be controlled. The working principle of the embodiment of FIG. 14 is the same as described in the previous figures and will not be discussed here in detail.

Figure 15A:
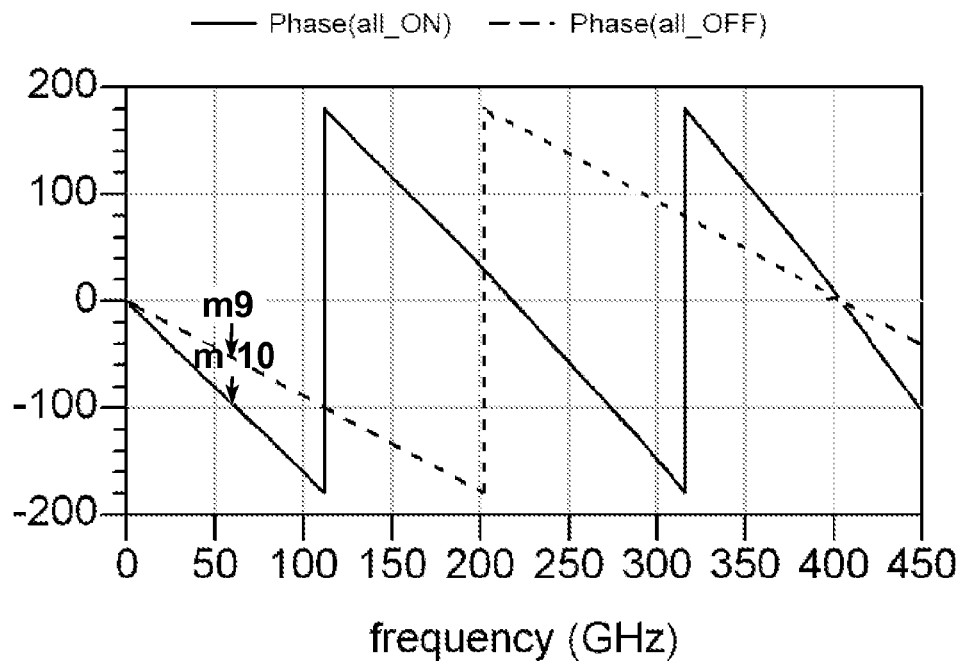
Figure 15B:
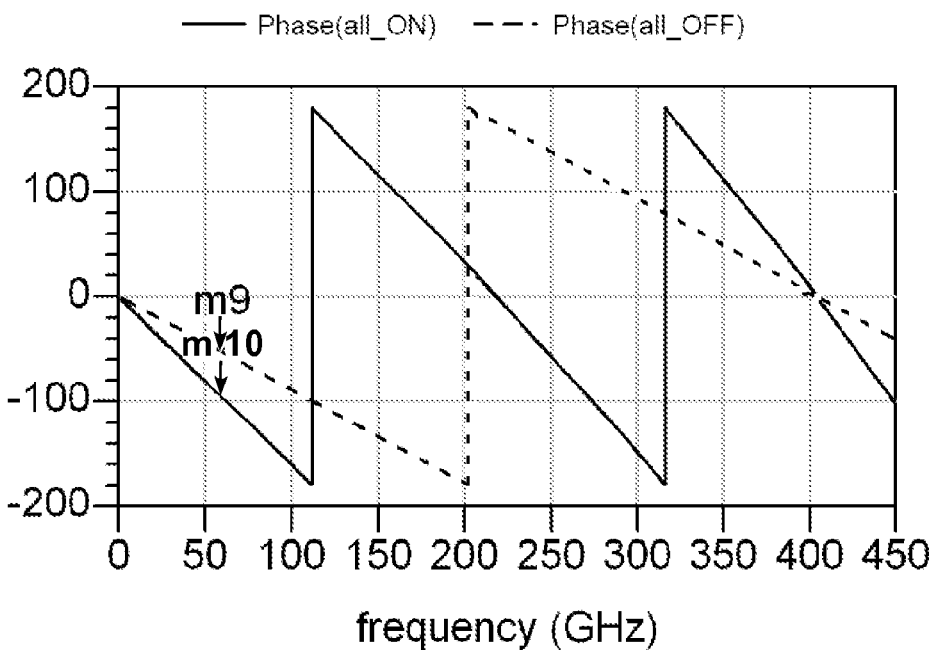
Figure 15C:
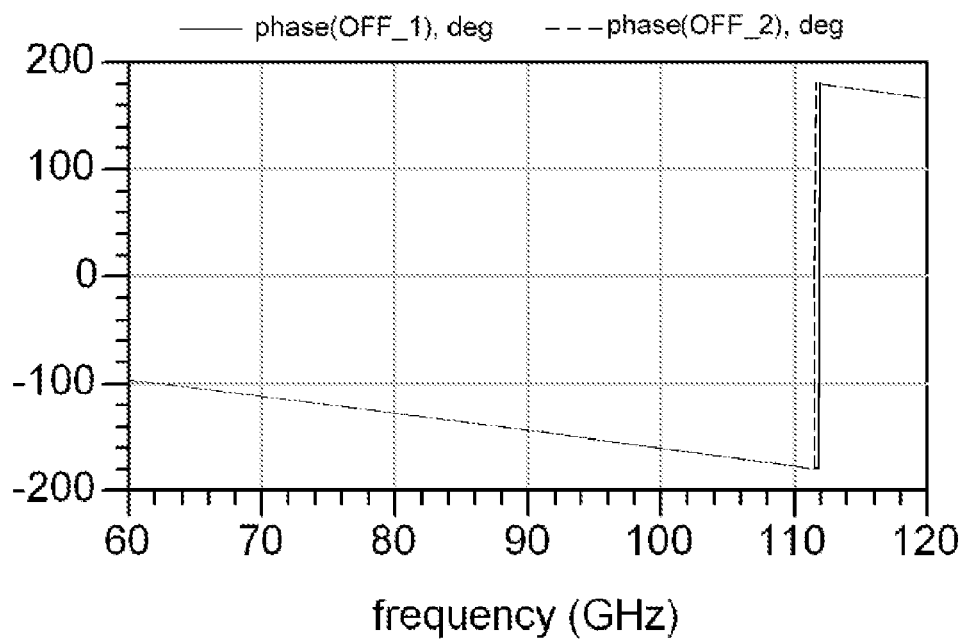
Figure 15D:
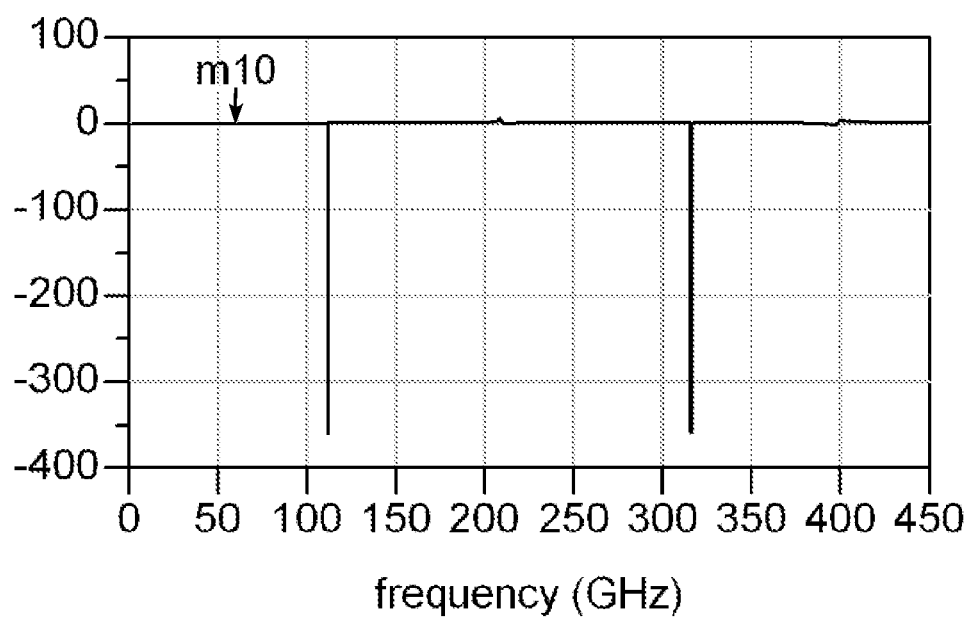
Figure 16A:
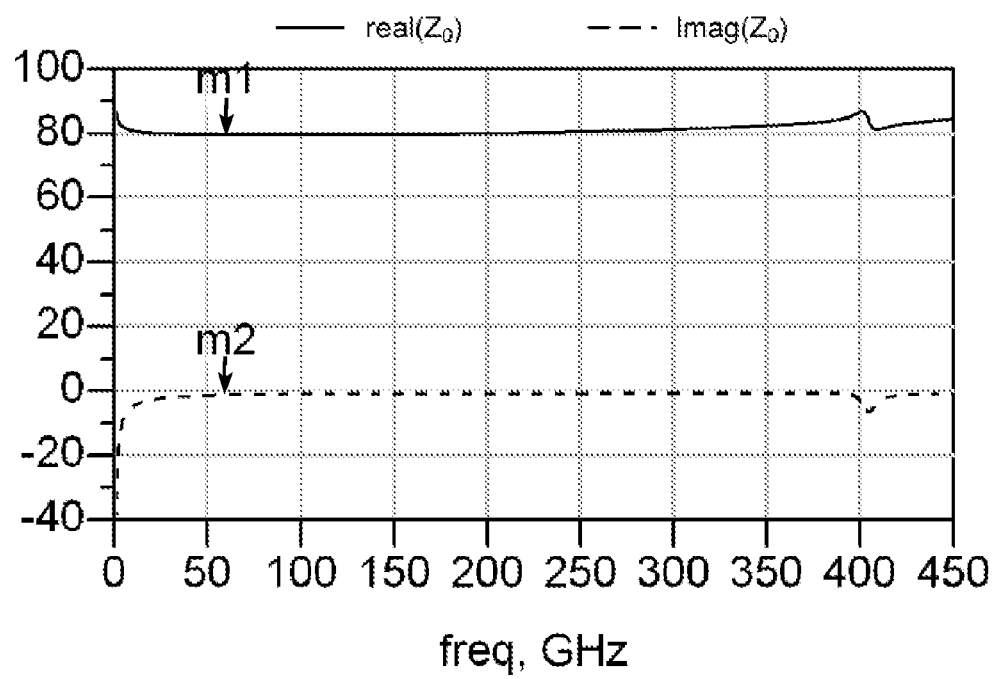
Figure 16B:
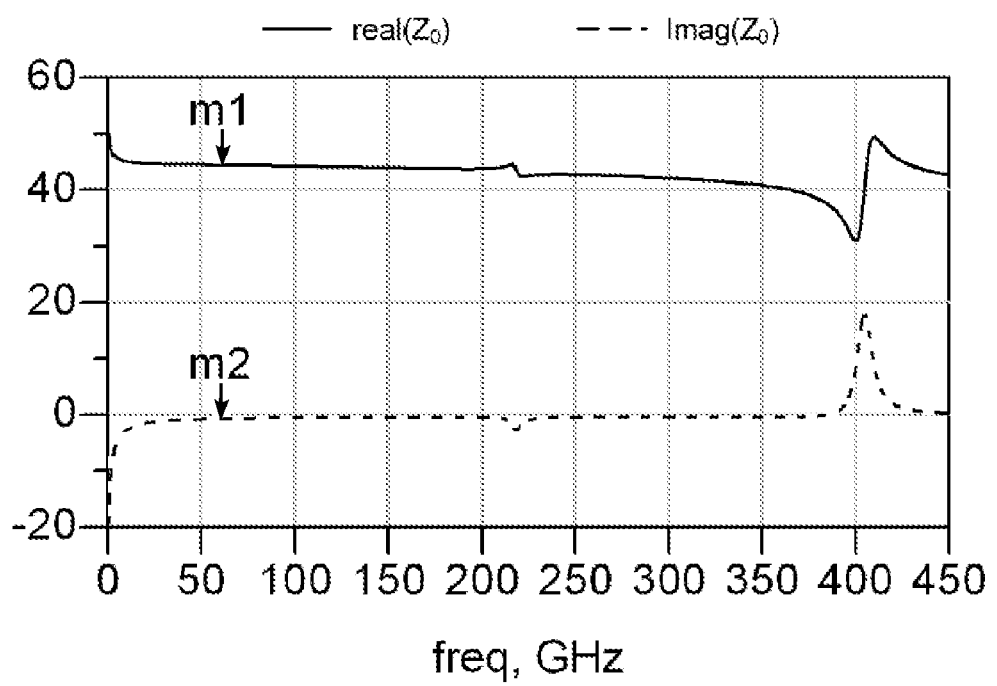
Figure 16C:
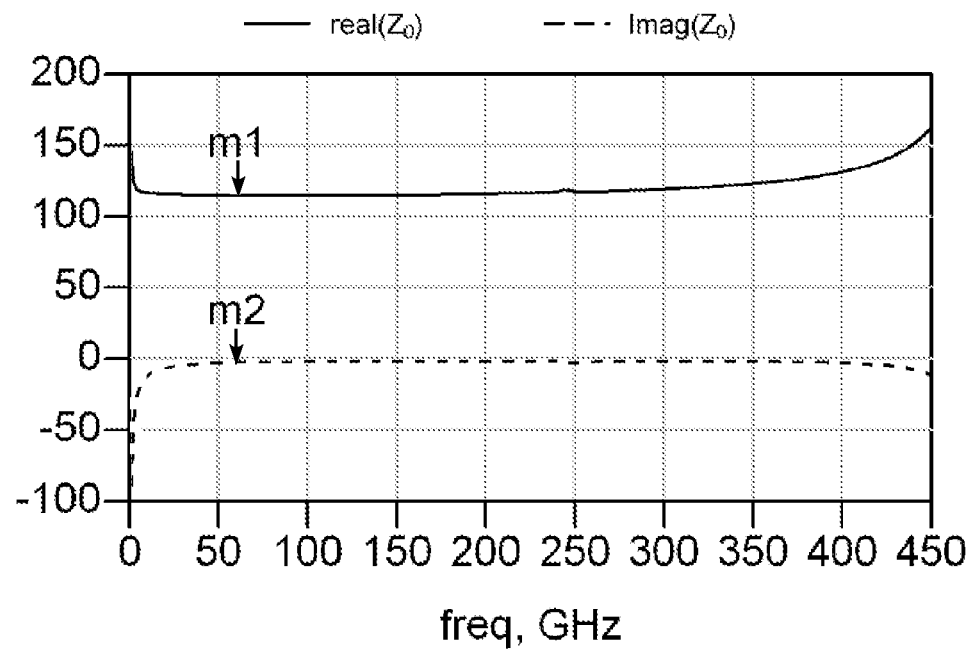
Figure 16D:
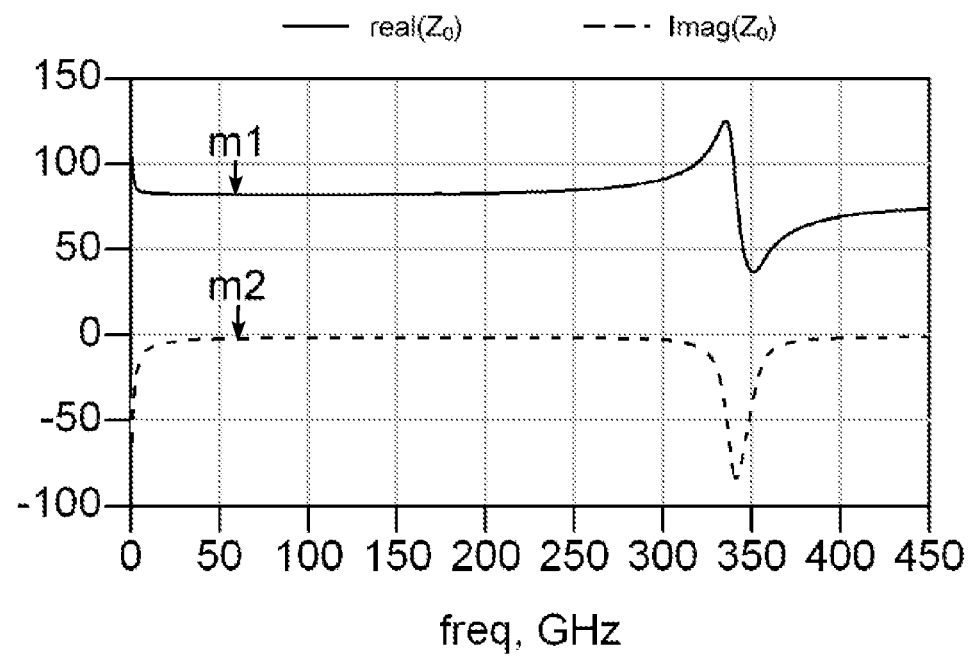

FIGS. 15A-15D show the simulated phase shift results of the DiCAD described in FIG. 14 with both ends terminated with a 50Ω load. The phase is a linear function of the length of the transmission line. FIG. 15A shows the phases of the output signal versus frequency with all switches turned OFF and ON. The frequency of point m9 is 60 GHz. The phase of point m9 is –53.58 deg. The frequency of point m10 is 60 GHz. The phase of point m10 is –96.57 deg. FIG. 15B shows the phase difference between all switched OFF and ON versus frequency. The phase difference is a linear function of the frequency. The frequency of point m11 is 60 GHz. The phase difference at that point is –42.990 deg. FIG. 15C plots the output phase with one switch and two switches OFF versus frequency. With this structure under simulation, a linear total phase shift of 43° and a phase shift step of 0.07° are achieved at 60 GHz. The signal attenuation is less than 0.8 dB. FIG. 15D shows a phase difference or phase step between one and two differences turned OFF versus frequency.

Switch Controlled Variable Impedance (SCVI)

The characteristic impedance of a transmission line with embedded artificial dielectric is given by $$Z_0 = \sqrt{\frac{L}{C_{DiCAD}}} \tag{7}$$

where L and $C_{DiCAD}$ are the inductance and the capacitance of the unit length of the transmission line respectively.

FIGS. 16A-16D show the characteristic impedances of two DiCAD transmission line structures. Structure one (FIGS. 16A and 16B) is the same as that used in the above SCO and phase shift designs. Point m1 in FIG. 16A has a frequency of 60 GHz and a real part of characteristic impedance real(Z0)= 79.6 Ohm. Point m2 in FIG. 16A has a frequency of 60 GHz and an imaginary part of characteristic impedance imag(Z0)= –1.3 Ohm. Point m1 in FIG. 16B has a frequency of 60 GHz and a real part of characteristic impedance real(Z0)=44.4 Ohm. Point m2 in FIG. 16B has a frequency of 60 GHz and an imaginary part of characteristic impedance imag(Z0)=–0.8 Ohm. In structure two (FIGS. 16C and 16D), L=536 μm (where L is the length of the metallic structures), W=5 μm (where W is the width of the metallic structure) and S=10 μm (where S is the spacing between the two metallic structures). Point m1 in FIG. 16C has a frequency of 60 GHz and a real part of characteristic impedance real(Z0)=114.86 Ohm. Point m2 in FIG. 16C has a frequency of 60 GHz and an imaginary part of characteristic impedance imag(Z0)=–2.97 Ohm. Point m1 in FIG. 16D has a frequency of 60 GHz and a real part of characteristic impedance real(Z0)=81.86 Ohm. Point m2 in FIG. 16D has a frequency of 60 GHz and an imaginary part of characteristic impedance imag(Z0)=–2.15 Ohm. 45% and 30% of characteristic impedance tuning over a wide bandwidth are obtained with structure one and two, respectively.

Switch Controlled Reconfigurable Filter (SCRF)

Fixed frequency/bandwidth bandpass or bandstop filters were implemented in the past by using dual lattice constant (spacing) frequency selective distributed Bragg reflector on PCB. See, for example, T.-H. Wang and T. Itoh, "Compact Grating Structure for Application to Filters and Resonators in Monolithic Microwave Integrated Circuits," IEEE Trans on MTT, Vol. MTT-35, No. 12, December 1987. By using DiCAD transmission lines on CMOS, lattice constants $d_A$ and $d_B$ can be reconfigured by digitally controlling DiCAD switches on or off, to vary the bandpass or bandstop filter characteristics, as shown in FIGS. 17A and 17B. This reconfigurable filtering structure has compact size, low insertion loss and ultra widely tunable bandwidth and center frequency.

Switch Controlled PLL/DLL

FIGS. 18A and 18B show the application of DiCAD embedded transmission lines to synthesizers, such as a phase-locked loop (PLL) (FIG. 18A) and a delay-locked loop (DLL) (FIG. 18B).

With reference to the PLL of FIG. 18A, a voltage controlled oscillator (VCO) 181 is connected to a transmission line 182. The VCO 181 can be a conventional VCO or a switch controlled oscillator (SCO) as described in FIG. 12A. The transmission line 182 is a λ/4 transmission line already described with reference to FIG. 14. The input 183 and the output 184 of the transmission line 182 are mixed in a mixer 185, the output of which is fed to a low pass filter 186 and a charge pump 187 connected to the VCO 181. The mixer 185, low pass filter 186 and charge pump 187 form part of the feedback loop of the PLL. The output 188 forms the phase-locked output of the PLL.

With reference to the DLL of FIG. 18B, many elements are identical to the embodiment of FIG. 18A. However, the output of the low pass filter 186 is sent to a control logic block 189, and the output of block 189 forms the digital control bits that control the switching of the MOS transistors of transmission line 182. The output 190 forms the phase-locked output of the DLL.

The advantages of these architectures include:
Low power;
No need of power-hungry high-speed frequency divider compared to conventional structures in high frequency circuits;
High speed;
Fast capturing and tracking time due to very short locking loop (no frequency divider chain);
Low spurs;
Errors in frequency and phase are corrected in every cycle (no delay caused by the long dividing chain in conventional structures);
Large capturing/tracking range;
DiCAD provides ultra wide of frequency tuning range.

DiCAD based SCO, SCPS, SCVI, SCRF and SCPLL/DLL are key building blocks to build software radio with reconfigurable, agile frequency hopping capability for multi-band and multi-mode communication systems. Advantages of the presently disclosed systems and methods include:

Ultra wide and linear tuning range on frequency, phase delay and characteristic impedance;
Digitally controllable tuning range with very fine tuning step, suitable for software radio implementation;
Wide impedance tuning is particularly important for linear power amplifier and wideband impedance matching.

On-chip DiCAD based SCOs, phase shifters, impedance matching network have been designed, simulated and implemented in silicon.

Digital controlled artificial dielectrics with wide tuning range on frequency, phase delay and impedance are important for software radio implementations. The DiCAD can be used to tune operating frequencies of components, such as resonators, antennas, filters, baluns, duplexers; to tune phase delay in transmission lines; to shrink the size of inductors and transformers. It can be inserted to circuits, such as amplifiers, mixers, filters, oscillators, PLLs/DLLs and any other circuits with large frequency, phase delay or impedance tuning requirements. The disclosed techniques and circuits are ideal for software radio building block circuits.

Two different structures have been shown in FIGS. 9 and 11. FIG. 9 shows a differential structure, where a ground reference is not needed because of the virtual ground present in all differential structures. FIG. 11 shows a non-differential structure in combination with a ground reference. The following examples of FIGS. 12A, 13, 14, 17A and 17B have been described with reference to the differential structure of FIG. 9. However, the person skilled in the art will understand, upon reading of the present disclosure, that the two structures of FIGS. 9 and 11 are interchangeable therebetween, and that the examples of FIGS. 12A, 13, 14, 17A and 17B could also be implemented with the structure shown in FIG. 11.

Further, with reference to the switch embodiments, while the presence of MOS or CMOS switches is to be preferred, other kinds of switches having three terminals or more can be used.

Therefore, in summary, according to one of the embodiments of the present disclosure, tuning devices and methods are disclosed. One of the devices comprises a metal structure connected with artificial dielectric elements, and variable capacitance devices. Each variable capacitance device is connected with a respective artificial dielectric element and with a control signal. Control of the variation of the capacitance allows the desired tuning. Another device comprises metallic structures connected with artificial dielectric elements and switches connected between the artificial dielectric elements. Turning ON and OFF the switches allows the capacitance between artificial dielectric elements to be varied and a signal guided by the metallic structures to be tuned.

While several illustrative embodiments of the invention have been shown and described, numerous variations and alternative embodiments will occur to those skilled in the art. Such variations and alternative embodiments are contemplated, and can be made without departing from the spirit and scope of the invention as defined in the appended claims.

What is claimed is:

1. A device comprising:
a plurality of artificial dielectric elements;
a metal structure coupled with the plurality of artificial dielectric elements; and
a plurality of variable capacitance devices, each variable capacitance device having a first end connected with a respective artificial dielectric element of the plurality of artificial dielectric elements, and a second end;
wherein the metal structure is a single-ended structure comprising a metal branch and a ground reference;
wherein each second end is adapted to be connected to a control signal, the control signal controlling variation of the capacitance of the variable capacitance devices.

2. The device of claim 1, wherein the metal structure is adapted to carry a signal to polarize particles in the artificial dielectric elements.

3. The device of claim 1, wherein the plurality of variable capacitance devices comprises groups of variable capacitance devices, each variable capacitance device of a same group having its second end adapted to be connected to a same control signal.

4. The device of claim 1, wherein the artificial dielectric elements are floating metal sheets.

5. The device of claim 1, wherein the metal structure is a differential structure comprising a first branch and a second branch.

6. The device of claim 5, wherein the first branch and the second branch are short-circuited at a first end thereof and open-circuited at a second end thereof.

7. The device of claim 6, wherein the short-circuited first end is connectable to additional circuitry through current coupling and the open-circuited second end is connectable to additional circuitry through voltage coupling.

8. The device of claim 1, wherein the metal structure is U-shaped.

9. The device of claim 1, said device being a voltage controlled oscillator, a frequency of the voltage controlled oscillator being tuned by said control signal.

10. A voltage controlled oscillator comprising:
a metallic structure to guide an input wave;
a plurality of artificial dielectric elements connected with the metallic structure, the input wave polarizing metal particles in the artificial dielectric elements; and
a plurality of variable capacitance devices, each variable capacitance device having a first end connected with a respective artificial dielectric element, and a second end adapted to be connected with a control signal, the second ends of the variable capacitance devices forming a control input of the voltage controlled oscillator to control the frequency of the input wave;
wherein the metallic structure is a single-ended structure comprising a metal branch and a ground reference.

11. The voltage controlled oscillator of claim 10, wherein the metallic structure is a differential structure comprising a first branch and a second branch.

12. The voltage controlled oscillator of claim 11, wherein the first and the second branch are short-circuited at a first end thereof and short-circuited at a second end thereof.

13. A method for tuning a signal, comprising:
coupling a metal structure with a plurality of artificial dielectric elements, the metal structure adapted to guide the signal to be tuned;
providing a plurality of variable capacitance devices, each variable capacitance device having a first end connected with a respective artificial dielectric element of the plurality of artificial dielectric elements, and a second end;
connecting each second end to at least one control signal; and
tuning the signal by varying the capacitance of the variable capacitance devices through the at least one control signal;
wherein the metal structure comprises a first branch and a second branch;
wherein the first branch and the second branch are short-circuited at a first end thereof and open-circuited at a second end thereof; and
connecting the short-circuited first end to additional circuitry through current coupling.

14. The method of claim 13, wherein the plurality of variable capacitance devices comprises groups of variable capacitance devices, each variable capacitance device of a same group having its second end connected to a same control signal.

15. The method of claim 13, wherein the artificial dielectric elements are floating metal sheets.

16. The method of claim 13, further comprising:
connecting the open-circuited second end to additional circuitry through voltage coupling.

17. The method of claim 13, wherein said signal is tuned to control frequency of a voltage controlled oscillator.

18. A device comprising:
a plurality of artificial dielectric elements;
a metal structure coupled with the plurality of artificial dielectric elements; and
a plurality of variable capacitance devices, each variable capacitance device having a first end connected with a respective artificial dielectric element of the plurality of artificial dielectric elements, and a second end;
wherein the metal structure is a differential structure comprising a first branch and a second branch;
wherein the first branch and the second branch are short-circuited at a first end thereof and open-circuited at a second end thereof;
wherein the short-circuited first end is connectable to additional circuitry through current coupling and the open-circuited second end is connectable to additional circuitry through voltage coupling; and
wherein each second end is adapted to be connected to a control signal, the control signal controlling variation of the capacitance of the variable capacitance devices.

19. The device of claim 18, wherein the metal structure is adapted to carry a signal to polarize particles in the artificial dielectric elements.

20. The device of claim 18, wherein the plurality of variable capacitance devices comprises groups of variable capacitance devices, each variable capacitance device of a same group having its second end adapted to be connected to a same control signal.

21. The device of claim 18, wherein the artificial dielectric elements are floating metal sheets.

22. The device of claim 18, wherein the metal structure is a single-ended structure comprising a metal branch and a ground reference.

23. The device of claim 18, wherein the metal structure is U-shaped.

24. The device of claim 18, said device being a voltage controlled oscillator, a frequency of the voltage controlled oscillator being tuned by said control signal.

25. A device comprising:
a plurality of artificial dielectric elements;
a metal structure coupled with the plurality of artificial dielectric elements; and
a plurality of variable capacitance devices, each variable capacitance device having a first end directly connected with a respective artificial dielectric element of the plurality of artificial dielectric elements, and a second end;
wherein each second end is adapted to be connected to a control signal, the control signal controlling variation of the capacitance of the variable capacitance devices.

26. The device of claim 25, wherein the metal structure is adapted to carry a signal to polarize particles in the artificial dielectric elements.

27. The device of claim 25, wherein the plurality of variable capacitance devices comprises groups of variable capacitance devices, each variable capacitance device of a same group having its second end adapted to be connected to a same control signal.

28. The device of claim 25, wherein the artificial dielectric elements are floating metal sheets.

29. The device of claim 25, wherein the metal structure is a differential structure comprising a first branch and a second branch.

30. The device of claim 25, wherein the metal structure is a single-ended structure comprising a metal branch and a ground reference.

31. The device of claim 25, wherein the first branch and the second branch are short-circuited at a first end thereof and open-circuited at a second end thereof.

32. The device of claim 25, wherein the short-circuited first end is connectable to additional circuitry through current coupling and the open-circuited second end is connectable to additional circuitry through voltage coupling.

33. The device of claim 25, wherein the metal structure is U-shaped.

34. The device of claim 25, said device being a voltage controlled oscillator, a frequency of the voltage controlled oscillator being tuned by said control signal.

35. A voltage controlled oscillator comprising:
a metallic structure to guide an input wave;
a plurality of artificial dielectric elements connected with the metallic structure, the input wave polarizing metal particles in the artificial dielectric elements; and
a plurality of variable capacitance devices, each variable capacitance device having a first end directly connected with a respective artificial dielectric element, and a second end adapted to be connected with a control signal, the second ends of the variable capacitance devices forming a control input of the voltage controlled oscillator to control the frequency of the input wave.

36. The voltage controlled oscillator of claim 35, wherein the metallic structure is a differential structure comprising a first branch and a second branch.

37. The voltage controlled oscillator of claim 35, wherein the metallic structure is a single-ended structure comprising a metal branch and a ground reference.

38. The voltage controlled oscillator of claim 36, wherein the first and the second branch are short-circuited at a first end thereof and short-circuited at a second end thereof.

39. A method for tuning a signal, comprising:
- coupling a metal structure with a plurality of artificial dielectric elements, the metal structure adapted to guide the signal to be tuned;
- providing a plurality of variable capacitance devices, each variable capacitance device having a first end directly connected with a respective artificial dielectric element of the plurality of artificial dielectric elements, and a second end;
- connecting each second end to at least one control signal; and
- tuning the signal by varying the capacitance of the variable capacitance devices through the at least one control signal.

40. The method of claim 39, wherein the plurality of variable capacitance devices comprises groups of variable capacitance devices, each variable capacitance device of a same group having its second end connected to a same control signal.

41. The method of claim 39, wherein the artificial dielectric elements are floating metal sheets.

42. The method of claim 39, wherein the metal structure comprises a first branch and a second branch.

43. The method of claim 42, wherein the first branch and the second branch are short-circuited at a first end thereof and open-circuited at a second end thereof.

44. The method of claim 43, further comprising:
- connecting the short-circuited first end to additional circuitry through current coupling.

45. The method of claim 43, further comprising:
- connecting the open-circuited second end to additional circuitry through voltage coupling.

46. The method of claim 39, wherein said signal is tuned to control frequency of a voltage controlled oscillator.

* * * * *